US010736211B2

(12) United States Patent
Park et al.

(10) Patent No.: US 10,736,211 B2
(45) Date of Patent: Aug. 4, 2020

(54) PRINTED CIRCUIT BOARD INCLUDING BENDING PORTION, AND ELECTRONIC DEVICE INCLUDING THE SAME

(71) Applicant: Samsung Electronics Co., Ltd., Gyeonggi-do (KR)

(72) Inventors: Jungsik Park, Gyeonggi-do (KR); Dohun Cha, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/543,702

(22) Filed: Aug. 19, 2019

(65) Prior Publication Data
US 2020/0060020 A1 Feb. 20, 2020

(30) Foreign Application Priority Data
Aug. 20, 2018 (KR) .................. 10-2018-0096590

(51) Int. Cl.
*H05K 1/02* (2006.01)
*G06F 1/16* (2006.01)
(Continued)

(52) U.S. Cl.
CPC ........... *H05K 1/028* (2013.01); *G06F 1/1616* (2013.01); *G06F 1/1618* (2013.01);
(Continued)

(58) Field of Classification Search
CPC ...... H05K 1/028; H05K 1/189; G06F 1/1616; G06F 1/1681; G06F 1/1683; G06F 1/1652
See application file for complete search history.

(56) References Cited

U.S. PATENT DOCUMENTS 9,480,155 B2 * 10/2016 Posner .................. G06F 1/1616
2003/0193772 A1 * 10/2003 Thomason ............ G06F 1/1616
361/679.27

(Continued)

OTHER PUBLICATIONS

International Search Report dated Nov. 22, 2019.

*Primary Examiner* — Nidhi Thaker
(74) *Attorney, Agent, or Firm* — Cha & Reiter, LLC.

(57) ABSTRACT

A foldable electronic device according to certain embodiments comprises a display, a cover covering one or more hinges, and a flexible printed circuit board disposed between the flexible display and the cover, wherein the flexible printed circuit board includes, a cover section accommodated in the cover, a first connection section extending to a first side of the cover section, and a second connection section extending to a second side of the cover section, wherein the cover section includes a first fixing area extending from the first connection section and configured to fix an area of the flexible printed circuit board to the electronic device, a second fixing area extending from the second connection section and configured to fix another area of the flexible printed circuit board to the electronic device, and a deformable area disposed between the first fixing area and the second fixing area, and wherein a number of multiple conductive layers forming the first fixing area and a number of conductive layers forming the second fixing area are equal to each other, and a number of multiple conductive layers forming the deformable area and the number of multiple conductive layers forming the first fixing area are different from each other.

20 Claims, 12 Drawing Sheets

(51) Int. Cl.
*H05K 1/18* (2006.01)
*H05K 1/14* (2006.01)

(52) U.S. Cl.
CPC .......... *G06F 1/1681* (2013.01); *G06F 1/1683* (2013.01); *H05K 1/147* (2013.01); *H05K 1/189* (2013.01); *H05K 2201/055* (2013.01); *H05K 2201/10128* (2013.01)

(56) References Cited

U.S. PATENT DOCUMENTS

| | | | |
|---|---|---|---|
| 2013/0271942 A1 | 10/2013 | Kim et al. | |
| 2014/0176840 A1 | 6/2014 | Hashido | |
| 2015/0049275 A1* | 2/2015 | Posner | G06F 1/1683 |
| | | | 349/42 |
| 2016/0301150 A1* | 10/2016 | Choi | H04M 1/0216 |
| 2016/0327993 A1* | 11/2016 | Garelli | G06F 1/203 |
| 2016/0334836 A1* | 11/2016 | Hong | G06F 1/1616 |
| 2017/0295642 A1 | 10/2017 | Codd et al. | |
| 2017/0343625 A1 | 11/2017 | Chu et al. | |
| 2018/0113493 A1* | 4/2018 | Silvanto | G06F 1/1616 |
| 2018/0159069 A1* | 6/2018 | Matsueda | G06F 1/1652 |

* cited by examiner

PRINTED CIRCUIT BOARD INCLUDING BENDING PORTION, AND ELECTRONIC DEVICE INCLUDING THE SAME

CROSS-REFERENCE TO RELATED APPLICATION(S)

This application is based on and claims priority under 35 U.S.C. 119 to Korean Patent Application No. 10-2018-0096590, filed on Aug. 20, 2018, in the Korean Intellectual Property Office, the disclosure of which is herein incorporated by reference in its entirety.

BACKGROUND

1. Field

Certain embodiments relate to a printed circuit board including a bending portion and an electronic device including the printed circuit board.

2. Description of Related Art

Due to the remarkable development of information communication technology and semiconductor technology, there has been a rapid increase in the distribution and use of various electronic devices. In particular, recent electronic devices are being developed such that users can communicate with each other while carrying the electronic devices.

Electronic devices may mean devices that perform specific functions according to programs incorporated therein. Such devices include an electronic scheduler, a portable multimedia reproducer, a mobile communication terminal, a tablet personal computer (PC), an image/sound device, a desktop PC, a laptop PC, or a vehicular navigation system, as well as home appliances. The above-mentioned electronic devices may output, for example, information stored therein as sound or an image. As the integration degree of such electronic devices has increased and super-high speed and large capacity wireless communication has become popular, various functions have recently been provided in a single electronic device, such as a mobile communication terminal. For example, various functions, such as an entertainment function (e.g., a game function), a multimedia function (e.g., a music/video reproducing function), a communication and security function for mobile banking, a schedule management function, and an e-wallet function, in addition to a communication function are integrated in a single electronic device. Such an electronic device has been miniaturized so that the user can conveniently carry the electronic device.

With the increased functionality, it becomes important to make the device user friendly. Displays can be used as both input and output devices and are user friendly. Accordingly, it is important to improve the display electronic devices.

SUMMARY

According to certain embodiments, an electronic device comprises a foldable housing including: a cover covering at least one hinge a first housing connected to the at least one hinge and including a first face oriented in a first direction, and a second face oriented in a second direction opposite to the first direction, and a second housing connected to the at least one hinge and including a third face oriented in a third direction, and a fourth face oriented in a fourth direction opposite to the third direction, the second housing structure being connected to the at least one hinge allowing the second housing rotate about the first housing, wherein, when the foldable housing is folded, the first face faces the third face, and when the foldable housing is unfolded, the third direction is a same as the first direction; a flexible display extending from the first face to the third face; a processor disposed in the first housing or the second housing; at least one camera disposed in the first housing or the second housing; a first ground member disposed in the first housing or the second housing; and a Flexible Printed Circuit Board (FPCB) extending from the first housing to the second housing across the cover, and including a bending portion in the cover, wherein, when the foldable housing is unfolded, the bending portion includes: at least one first conductive line that forms a ground on a first layer, at least one second conductive line disposed on a second layer disposed between the flexible display and the first layer, and at least one third conductive line provided on a third layer disposed on a side opposite a side on which the second layer is disposed with reference to the first layer, and wherein the first conductive line is electrically connected to the first ground member, the second conductive line is connected to at least one of the camera and the flexible display, and the third conductive line is electrically connected to the processor.

An electronic device according to certain embodiments may include, a cover covering at least one hinge; a first housing connected to the at least one hinge and including a first main circuit board; a second housing connected to the at least one hinge structure and including a second main circuit board, the second housing being rotatable about the first housing; a flexible display extending from a face of the first housing to a face of the second housing and disposed to face the cover; and a Flexible Printed Circuit Board (FPCB) extending from the first housing to the second housing across the cover, and disposed between the flexible display and the cover, the FPCB including a bending portion, wherein the FPCB includes: a first conductive layer in which a first conductive line forming a ground is disposed, a second conductive layer including a second conductive line disposed between the flexible display and the first conductive line, and a third conductive layer including a third conductive line disposed on a side opposite a side on which the second conductive line is disposed with reference to the first conductive line, wherein the first conductive line is electrically connected to a ground plane formed in the first housing or the second housing, and the second conductive line includes an antenna signal line.

A foldable electronic device according to certain embodiments comprises a display; a cover covering one or more hinges; and a flexible printed circuit board disposed between the flexible display and the cover, wherein the flexible printed circuit board includes: a cover section accommodated in the cover, a first connection section extending to a first side of the cover section, and a second connection section extending to a second side of the cover section, wherein the cover section includes: a first fixing area extending from the first connection section and configured to fix an area of the flexible printed circuit board to the electronic device, a second fixing area extending from the second connection section and configured to fix another area of the flexible printed circuit board to the electronic device, and a deformable area disposed between the first fixing area and the second fixing area, and wherein a number of multiple conductive layers forming the first fixing area and a number of conductive layers forming the second fixing area are equal to each other, and a number of multiple conductive layers forming the deformable area and the number of multiple conductive layers forming the first fixing area are different from each other.

BRIEF DESCRIPTION OF THE DRAWINGS

The above and other aspects, features, and advantages of the disclosure will be more apparent from the following detailed description taken in conjunction with the accompanying drawings, in which:

FIG. 8A, FIG. 8B, and FIG. 8C illustrate a printed circuit board of an electronic device according to certain embodiments, in which FIG. 8A is a view illustrating the state in which the printed circuit board is disposed in the inner space of a cover, FIG. 8B is a cross-sectional view of the printed circuit board, and FIG. 8C is a front view illustrating the state in which the printed circuit board is unfolded;

DETAILED DESCRIPTION

As the mobile communication service is extended to the multimedia service area, the sizes of the displays of electronic devices may be increased so as to allow the users to fully utilize a multimedia service as well as a voice call or a short message service. Thus, according to certain embodiments, a foldable display may be placed over the entire area of housing structures, which is separated to be foldable. In addition, electronic components, which are disposed in respective housing structures separated around a hinge structure provided for folding, may be connected to each other through a flexible printed circuit board.

According to certain embodiments, the structure of a flexible printed circuit board, which is disposed in a deformable area of a foldable electronic device, is improved such that, even when the electronic device is unfolded, a smooth data transmission characteristic can be implemented regardless of whether or not the flexible printed circuit board comes into contact with metal.

A foldable electronic device may include multiple housing structures, which are rotatable relative to each other. In order to reduce the force applied to a display during the folding operation of the electronic device, multiple screws may be arranged in a hinge structure and an axis of the hinge structure may be configured to be movable to a rear side of the display.

With this arrangement, in the unfolded state of the electronic device, since the flexible printed circuit board may be brought into contact with a face of the hinge structure made of metal, impedance may be altered. For example, due to the contact between the printed circuit board and the hinge structure, impedance variation may occur in a portion (e.g., a deformable area) of the printed circuit board including an impedance wiring line, which may deteriorate data transmission.

With an electronic device according to certain embodiments, it is possible to improve the performance of a flexible printed circuit board by disposing a copper foil (e.g., a wiring line) on only one face of a conductive layer of the flexible printed circuit board.

Figure 1:
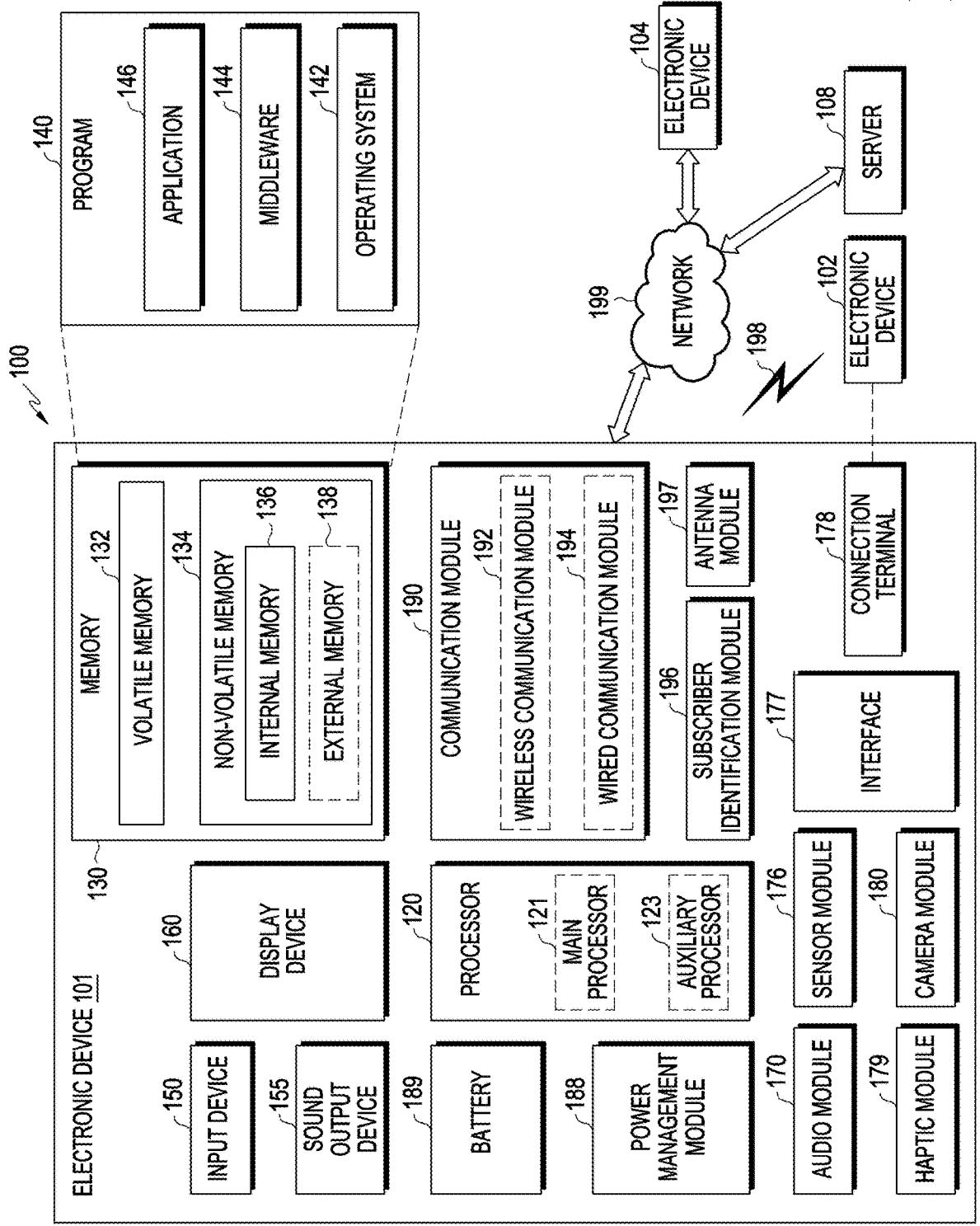
FIG. 1 is a block diagram of an electronic device according to certain embodiments in a network environment.

With an electronic device according to certain embodiments, it may be possible to provide improved data transmission characteristics by preventing impedance of the flexible printed circuit board from being distorted regardless of the spreading operation and the folding operation of the electronic device. FIG. 1 is a block diagram illustrating an electronic device 101 in a network environment 100 according to certain embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing recordings, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199

(e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

To improve the user experience, while allowing the device to be compact for carrying, the electronic device 101 may be foldable as described below.

Figure 2:
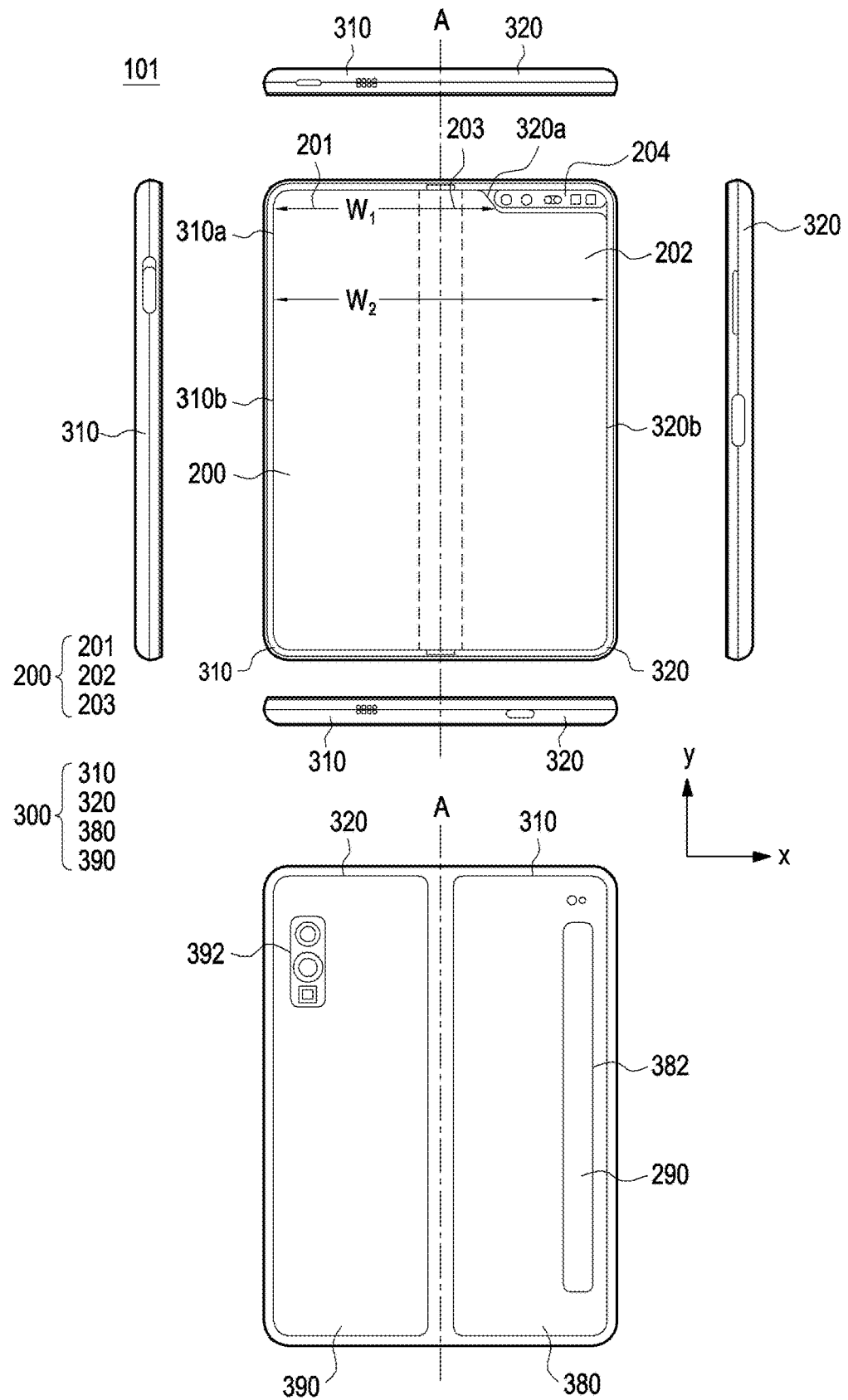
FIG. 2 is a view illustrating the unfolded state of an electronic device according to certain embodiments.
Figure 3:
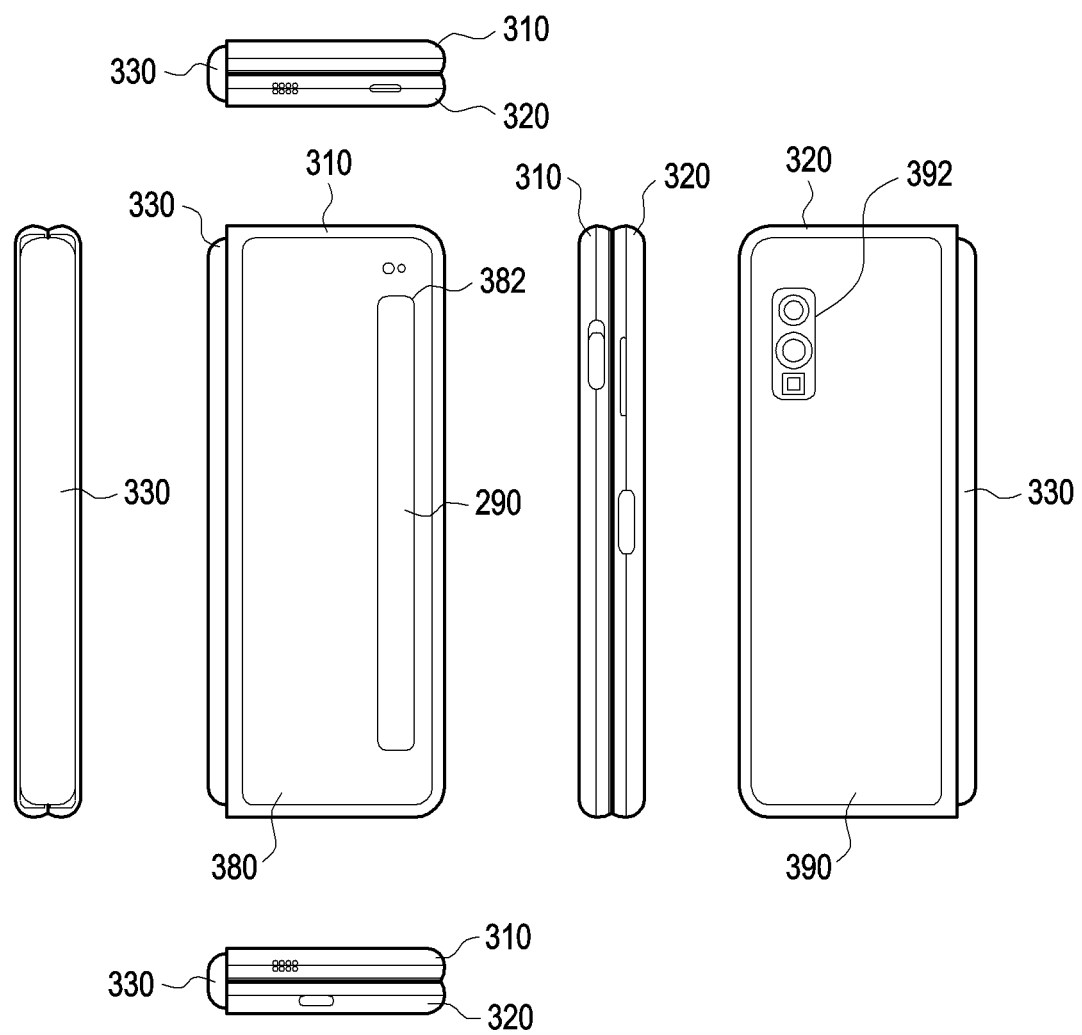
FIG. 3 is a view illustrating the folded state of an electronic device according to certain embodiments.

FIG. 2 is a view illustrating the unfolded state (i.e., unfolded) of an electronic device according to certain embodiments. FIG. 3 is a view illustrating the folded state (i.e. folded) of an electronic device according to certain embodiments.

According to certain embodiments, an electronic device may includes a first housing 310 and a second housing 320 rotably connected by a hinge 500. The first housing 310 can be in a folded state (as shown in FIG. 2) or an unfolded state (as showing in FIG. 3). When the device is in the unfolded state, a display 200 is formed by a first display area 201, on a face of the first housing 320, and a second display area 202 on a face of the second housing structure. Flexible display area 203 is between the first display area 201 and the second display area 202. When the electronic device is in the unfolded state, the first display area 201 flexible display area 203 and the second display area 202 may form a continuous display 200. The continuous display 200 is forms a single plane and, according to certain embodiments, appears to be a single continuous surface.

Referring to FIG. 2 and FIG. 3, in an embodiment, an electronic device 101 may include a foldable housing 300, a cover (e.g., a cover 330 in FIG. 3B) that covers the foldable portion of the foldable housing 300, and a flexible or foldable display 200 (hereinafter, simply referred to as a "display" 200) (e.g., the display device 160 in FIG. 1) disposed in the space defined by the foldable housing 300. According to an embodiment, the face on which the display 200 is disposed is defined as the front face of the electronic device 101. The face opposite the front face is defined as the rear face of the electronic device 101. In addition, the face surrounding the space between the front face and the rear surface is defined as the side face of the electronic device 101.

Figure 5:
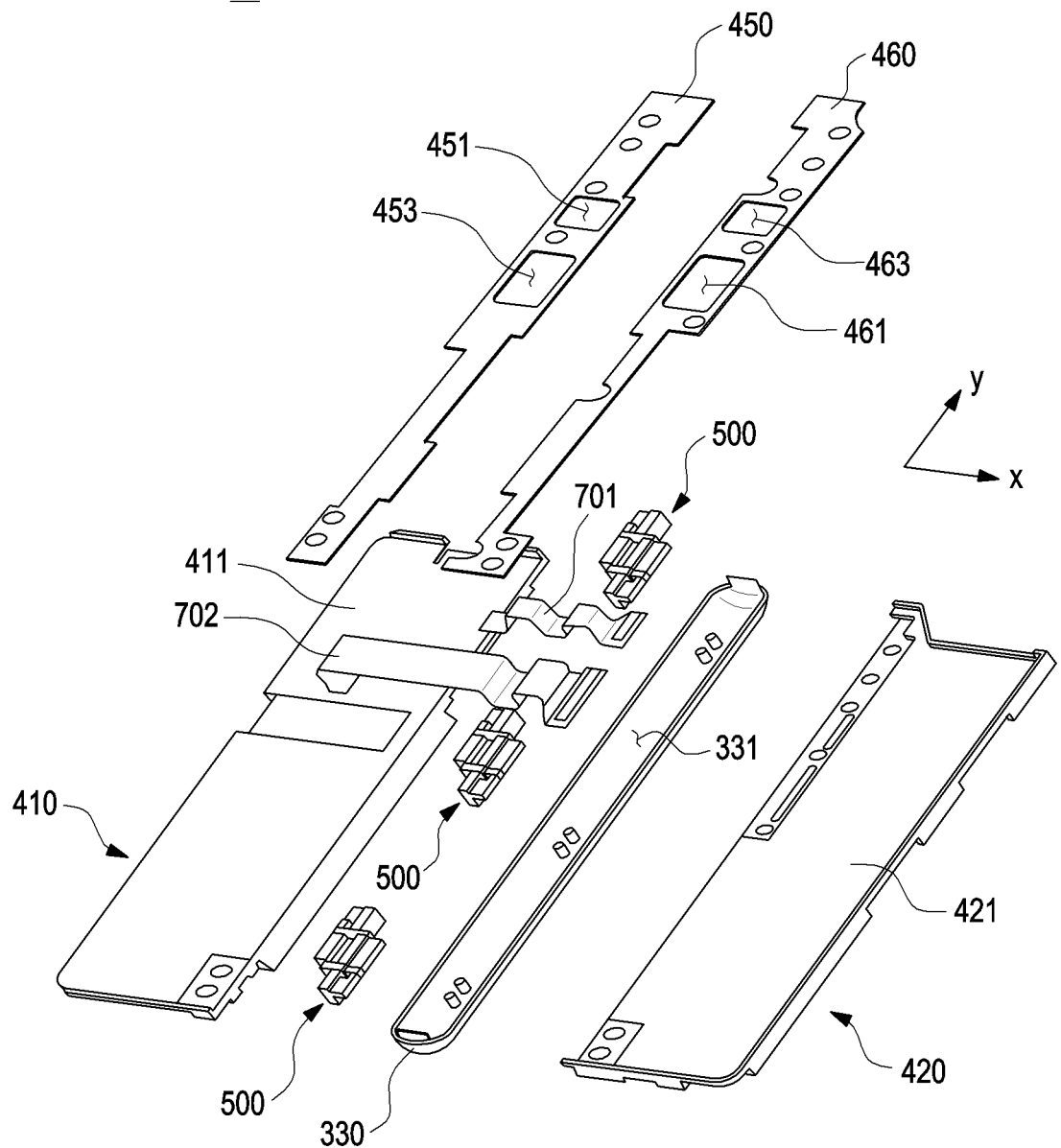
FIG. 5 is an exploded perspective view illustrating a bracket assembly of an electronic device according to certain embodiments.

According to certain embodiments, the foldable housing 300 may include a first housing 310, a second housing 320 including a sensor area 204, a first rear cover 380, a second rear cover 390, and a hinge (e.g., a hinge 500 in FIG. 5, the term "hinge" shall be understood to mean one or more hinges unless stated otherwise). The term "housing" shall not construed to only include structures the completely cover the contents therein and can include, without limitation, structures with openings or portions thereof. The foldable housing 300 of the electronic device 101 is not limited to the shapes and assemblies illustrated in FIGS. 2 and 3, but may be implemented by other shapes or other combinations and/or assemblies of components. For example, in another embodiment, the first housing 310 and the first rear cover 380 may be integrally formed, and the second housing 320 and the second rear cover 390 may be integrally formed.

According to certain embodiments, the first housing 310 may be connected to the hinge 500, and may include a first face oriented in a first direction and a second face oriented in a second direction opposite the first direction. The second housing 320 may be connected to the hinge 500, and may include a third face oriented in a third direction and a fourth face oriented in a fourth direction opposite the third direction. The second housing 320 is rotatable about the first housing 310 relative to the hinge 500. Accordingly, the electronic device 101 may be deformable into a folded state or an unfolded state. In the folded state of the electronic device 101, the first face may face the third face, and in the unfolded state, the third direction may be the same as the first direction.

According to certain embodiments, the first housing 310 and the second housing 320 may be disposed on opposite sides about a folding axis A and have a generally symmetrical shape with respect to the folding axis A. The first housing 310 and the second housing 320, as will be described later, have different angles or distances from each other depending on whether the electronic device 101 is in the unfolded state, in the folded state, or in the intermediate state. According to an embodiment, unlike the first housing 310, the second housing 320 may further include the sensor area 204 in which various sensors are disposed. However, the first housing 310 and the second housing 320 may have mutually symmetrical shapes in other areas.

According to certain embodiments, as illustrated in FIG. 2, the first housing 310 and the second housing 320 may form a recess that accommodates the display 200 therein. According to an embodiment, due to the sensor area 204, the recess may have two or more different widths in a direction perpendicular to the folding axis A.

According to an embodiment, the recess may have a first width $w_1$ between a first portion 310a parallel, substantially parallel, or within 5 degrees of parallel, to the folding axis A of the first housing 310 and a first portion 320a formed at an edge of the sensor area 204 of the second housing 320. The recess may have a second width $w_2$ formed by a second portion 310b of the first housing 310 and a second portion 320b, which is parallel to the folding axis A while not corresponding to the sensor area 204 in the second housing 320. In this case, the second width $w_2$ may be longer than the first width $w_1$. As another example, the first portion 310a of the first housing 310 and the first portion 320a of the second housing 320, which have mutually asymmetric shapes, may form the first width $w_1$ of the recess, and the second portion 310b of the first housing 310 and the second portion 320b of the second housing 320, which have mutually symmetric shapes, may form the second width $w_2$ of the recess. According to an embodiment, the first portion 320a and the second portion 320b of the second housing 320 may have different distances from the folding axis A, respectively. The widths of the recess are not limited to the illustrated example. In another embodiment, the recess may have multiple widths due to the shape of the sensor area 204 or due to the portions of the first housing 310 and the second housing 320, which have asymmetric shapes.

According to certain embodiments, at least a portion of the first housing 310 and at least a portion the second housing 320 may be formed of a metal or non-metal material having the rigidity of a level selected to support the display 200. The at least a portion formed of the metal material may provide a ground plane of the electronic device 101, and may be electrically connected to a ground line formed on a printed circuit board (e.g., the printed circuit board in FIG. 5).

According to certain embodiments, the sensor area 204 may be formed to have a predetermined area adjacent to one corner of the second housing 320. However, the arrangement, shape, and size of the sensor area 204 are not limited to those in the illustrated example. For example, in another embodiment, the sensor area 204 may be provided at another corner of the second housing 320 or in any area between the upper and lower end corners. In an embodiment, components embedded in the electronic device 101 to perform various functions may be exposed to the front face of the electronic device 101 through the sensor area 204 or one or more openings provided in the sensor area 204. In certain embodiments, the components may include various types of sensors. The sensors may include at least one of, for example, a front camera, a receiver, or a proximity sensor.

According to certain embodiments, the first rear cover 380 may be disposed on one side of the folding axis in the rear face of the electronic device 101, and may have, for example, a substantially rectangular periphery, and the periphery may be enclosed by the first housing structure 301. Similarly, the second rear cover 390 may be disposed on the other side of the folding axis of the rear face of the electronic device 101, and the periphery of the second rear cover 390 may be enclosed by the second housing 320.

According to certain embodiments, the first rear cover 380 and the second rear cover 390 may have substantially symmetrical shapes about the folding axis (the axis A). However, the first rear cover 380 and the second rear cover 390 do not necessarily have mutually symmetrical shapes, and in another embodiment, the electronic device 101 may include the first rear cover 380 and the second rear cover 390 having various shapes. In a still another embodiment, the second rear cover 390 may be formed integrally with the second housing 320, and the first rear cover 380 may be formed integrally with the first housing 310.

According to certain embodiments, the first rear cover 380, the second rear cover 390, the first housing 310, and the second housing 320 may define a space in which various components (e.g., a printed circuit board, or a battery) of the electronic device 101 can be arranged. According to an embodiment, one or more components may be disposed or visually exposed on the rear face of the electronic device 101. For example, at least a portion of a sub-display 290 may be visually exposed through a first rear area 382 of the first rear cover 380. In another embodiment, one or more components or sensors may be visually exposed through a second rear region 392 of the second rear cover 390. In certain embodiments, the sensors may include a proximity sensor and/or a backside camera.

According to certain embodiments, a front camera exposed to the front face of the electronic device 101 through the one or more openings provided in the sensor area 204 or a rear camera exposed through the second rear area 392 of the second rear cover 390 may include one or more lenses, an image sensor, and/or an image signal processor. A flash 313 may include, for example, a light-emitting diode or a xenon lamp. In some embodiments, two or more lenses (e.g., an infrared camera lens, a wide-angle lens, and a telephoto lens) and image sensors may be disposed on one face of the electronic device 101.

Referring to FIG. 3, the cover 330 may be disposed between the first housing 310 and the second housing 320 so as to cover internal components (e.g., the hinge 500). According to an embodiment, the cover 330 may be covered by a portion of the first housing and a portion of the second housing 320, or may be exposed to the outside depending on the state of the electronic device 101 (the unfolded state or the folded state).

According to an embodiment, as illustrated in FIG. 2, when the electronic device 101 is in the unfolded state, the cover 330 may be covered by the first housing 310 and the second housing 320 so as not be exposed. As another example, as illustrated in FIG. 3, when the electronic device 101 is in the folded state (e.g., the fully folded state), the cover 330 may be exposed to the outside between the first housing 310 and the second housing 320. As still another example, when the first housing 310 and the second housing 320 are in the intermediate state in which the first housing 310 and the second housing 320 are folded to form a predetermined angle therebetween, a portion of the cover 330 may be exposed to the outside between the first housing 310 and the second housing 320. In this case, however, the exposed area may be less than that in the fully folded state. In an embodiment, the cover 330 may include a curved face.

According to certain embodiments, the display 200 may be disposed on a space formed by the foldable housing 300. For example, the display 200 may be seated on the recess formed by the foldable housing 300, and may constitute most of the front face of the electronic device 101. Accordingly, the front face of the electronic device 101 may include the display 200 and a portion of the first housing 310 and a portion of the second housing 320, which are adjacent to the display 200. In addition, the rear face of the electronic device 101 may include the first rear cover 380, a portion of the first housing 310 adjacent to the first rear cover 380, the second rear cover 390, and a portion of the second housing 320 adjacent the second rear cover 390.

According to certain embodiments, the display 200 may refer to a display in which at least a portion is deformable into a planar face or a curved face. According to an embodiment, the display 200 may include a folding area 203, a first area 201 disposed on one side of the folding area 203 (e.g., the left side of the folding area 203 illustrated in FIG. 2) and a second area 202 disposed on the other side of the folding area 203 (e.g., the right side of the folding area 203 illustrated in FIG. 2).

However, the area division of the display 200 illustrated in FIG. 2 is exemplary, and the display 200 may be divided into multiple areas (e.g., four or more or two areas) depending on the structures or functions thereof. For example, in the embodiment illustrated in FIG. 2, the areas of the display 200 may be divided by the folding area 203 or the folding axis (the axis A) extending parallel to the y axis. However, in another embodiment, the areas of the display 200 may be divided on the basis of another folding area (e.g., a folding area parallel to the x axis) or another folding axis (e.g., a folding axis parallel to the x axis). According to an embodiment, the display 200 may be coupled to or disposed adjacent to a touch-sensing circuit, a pressure sensor that is capable of measuring touch intensity (pressure), and/or a digitizer that detects a magnetic field-type stylus pen.

According to certain embodiments, the first area 201 and the second area 202 may have generally symmetrical shapes about the folding area 203. However, unlike the first area 201, the second area 202 may include a notch cut due to the presence of the sensor area 204, but may have a symmetrical shape with the first area 201 in the area other than the sensor area. In other words, the first area 201 and the second area 202 may include portions having mutually symmetrical shapes and portions having mutually asymmetrical shapes.

Hereinafter, the operations of the first housing 310 and the second housing 320 according to the state of the electronic device 101 (e.g., a flat or unfolded state and a folded state) and respective areas of the display 200 will be described.

According to certain embodiments, when the electronic device 101 is in the folded state (e.g., FIG. 2), the first housing 310 and the second housing 320 may be disposed to form an angle of 180 degrees therebetween and to be oriented in the same direction. The surface of the first area 201 and the surface of the second area 202 of the display 200 form 180 degrees relative to each other, and may be oriented in the same direction (e.g., the front direction of the electronic device). The folding area 203 may form the same plane as the first area 201 and the second area 202.

According to certain embodiments, when the electronic device 101 is in the folded state (e.g., FIG. 3), the first housing 310 and the second housing 320 may be disposed to face each other. The surface of the first area 201 and the face of the second area 202 of the display 200 may face each other while forming a narrow angle (e.g., an angle between 0 and 10 degrees) relative to each other. At least a portion of the folding area 203 may be a curved face having a predetermined curvature.

According to certain embodiments, when the electronic device 101 is in the intermediate state (e.g., FIG. 3), the first housing 310 and the second housing 320 may be disposed to form a predetermined angle relative to each other. The surface of the first area 201 and the surface of the second area 202 of the display 200 may form an angle larger than that in the folded state and smaller than that in the unfolded state. At least a portion of the folding area 203 may have a curved face having a predetermined curvature, and the curvature at this time may be smaller than that in the folded state.

Figure 4:
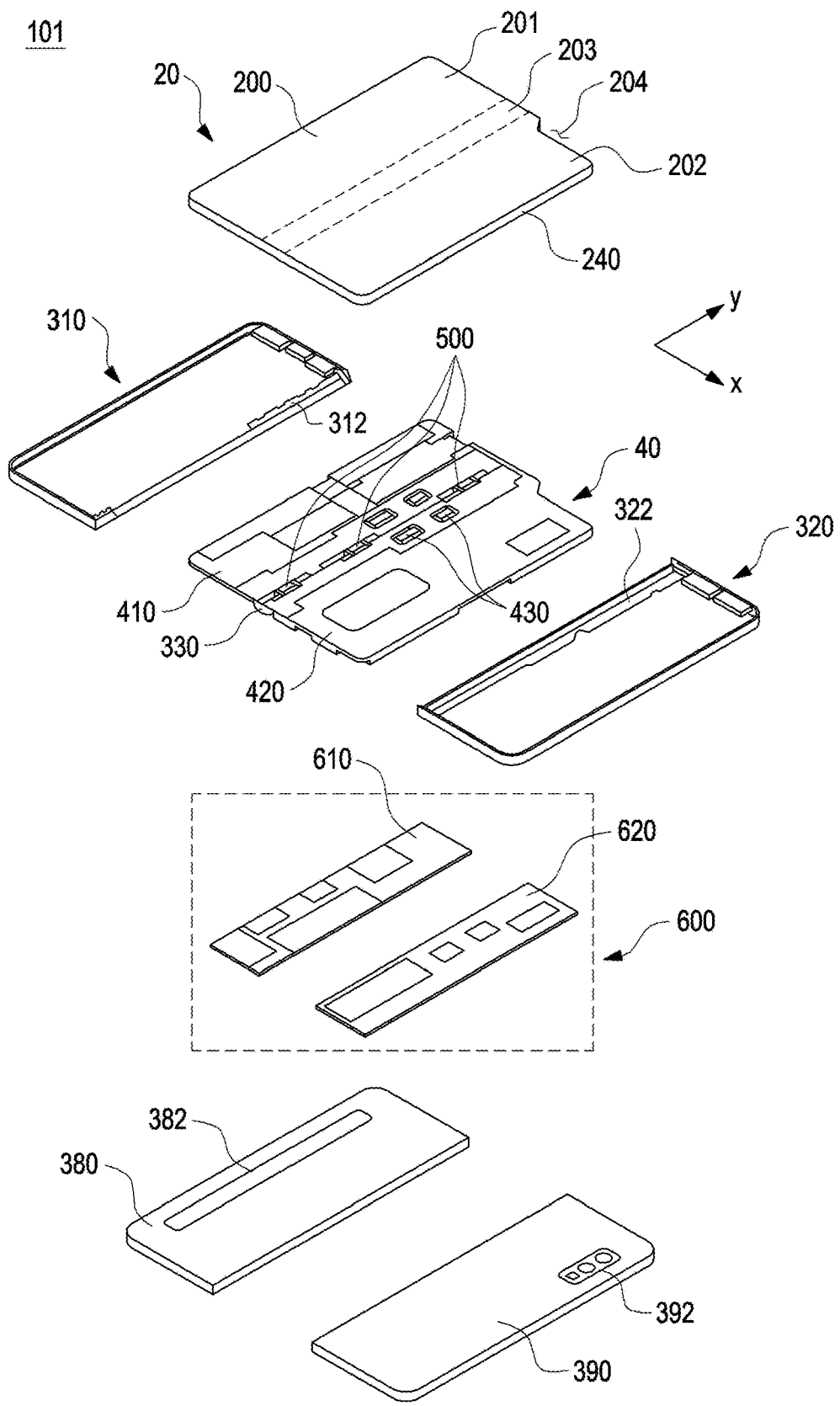
FIG. 4 is an exploded perspective view illustrating an electronic device according to certain embodiments.

FIG. 4 is an exploded perspective view illustrating an electronic device according to certain embodiments.

Referring to FIG. 4, in certain embodiments, the electronic device 101 may include a foldable housing, a display unit 20, a bracket assembly 40, and a board unit 600. The foldable housing may include the first housing 310, the second housing 320, the bracket assembly 40, the first rear cover 380, and the second rear cover 390. The display unit 20 may be referred to as a display module or a display assembly.

According to certain embodiments, the display unit 20 may include the display 200 and at least one plate or layer 240 on which the display 200 is mounted. In an embodiment, the plate 240 may be disposed between the display 200 and the bracket assembly 40.

According to certain embodiments, the bracket assembly 40 may include a first bracket 410, a second bracket 420, hinges 500 disposed between the first bracket 410 and the second bracket 420, and a cover 330 that covers the hinges 500 when viewed from the outside. As another example, a printed circuit board (e.g., the printed circuit board 700 of FIG. 5) (e.g., a flexible printed circuit board (FPC)) may be disposed across the first bracket 410 and the second bracket 420.

According to certain embodiments, the FPC can make contact with the hinges 500 without causing distortion in the impedance of the FPC and avoiding distortion of the signals passed therein.

According to certain embodiments, the board unit 600 may include a first circuit board 610 disposed on the first bracket 410 side and a second circuit board 620 disposed on the second bracket 420 side. The first circuit board 610 and the second circuit board 620 may be disposed in a space defined by the bracket assembly 40, the first housing 310, the second housing 320, the first rear cover 380, and the second rear cover 390. Components for implementing various functions of the electronic device 101 may be mounted on the first circuit board 610 and the second circuit board 620.

According to certain embodiments, the first housing 310 and the second housing 320 may be assembled so as to be coupled to the opposite sides of the bracket assembly 40 in the state in which the display unit 20 is coupled to the bracket assembly 40. According to an embodiment, the first housing 310 may include a first rotational support face 312, and the second housing 320 may include a second rotational support face 322, which corresponds to the first rotational support structure 312. The first rotational support face 312 and the second rotational support face 322 may include curved faces corresponding to curved surfaces included in the cover 330.

According to an embodiment, when the electronic device 101 is in the unfolded state (e.g., the electronic device in FIG. 2), the first rotational support face 312 and the second rotational support face 322 may cover the cover 330 so that the cover 330 may not be exposed to the rear face of the electronic device 101 or may be exposed to the rear face of the electronic device 101 to a minimum. As still another embodiment, when the electronic device 101 is in the folded state (e.g., the electronic device in FIG. 3), the first rotational support face 312 and the second rotational support face 322 may rotate along the curved faces included in the cover 330 so that the cover 330 may be exposed to the rear face of the electronic device 101 to a maximum.

Figure 6:
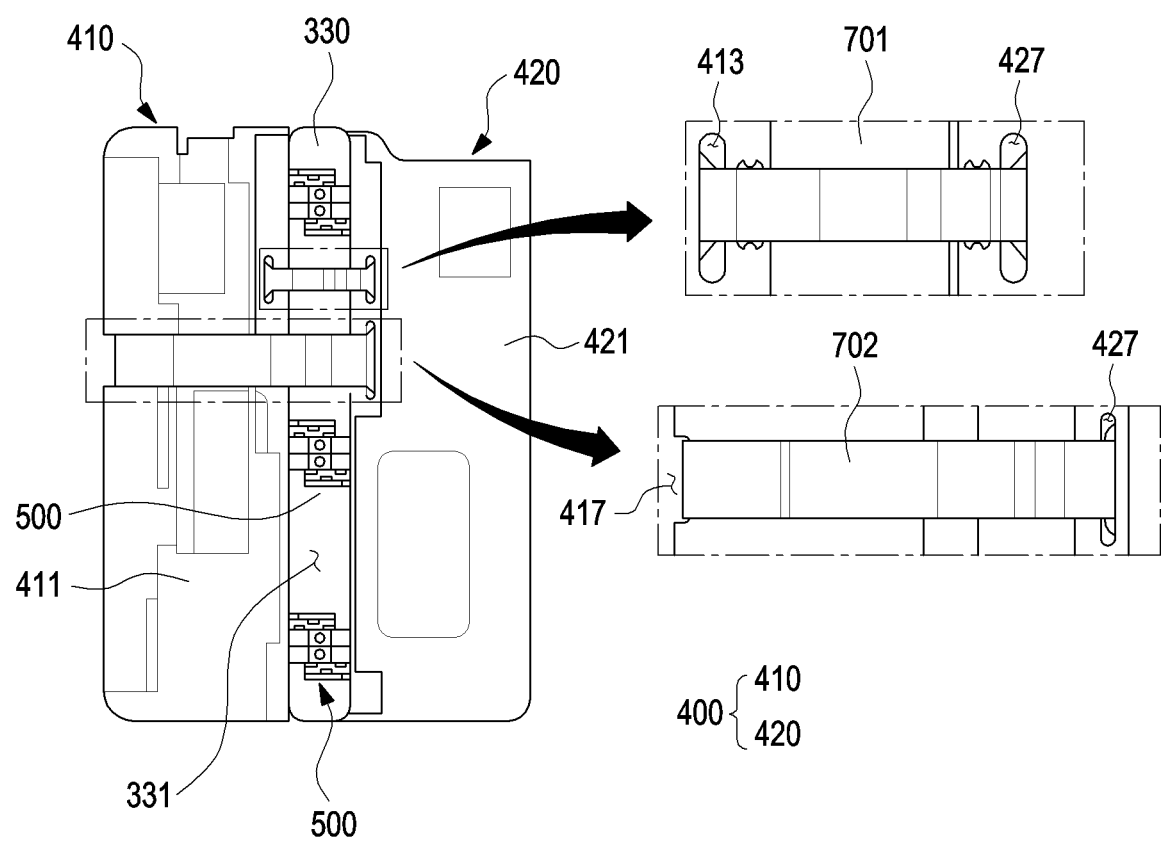
FIG. 6 is a view illustrating a printed circuit board of an electronic device according to certain embodiments.

FIG. 5 is an exploded perspective view illustrating a bracket assembly of an electronic device according to certain embodiments. FIG. 6 is a view illustrating a printed circuit board of an electronic device according to certain embodiments.

Referring to FIG. 5 and FIG. 6, the bracket assembly 40 may include hinges 500 and a bracket 400 disposed inside the cover 330. The bracket 400 may include a first bracket 410, a second bracket 420, a cover 330 disposed between the first and second brackets 410 and 420, a first hinge bracket 450 connecting the hinges 500 and the first bracket 410, a second hinge bracket 460 connecting the hinges 500 and the second bracket 420, and one or more printed circuit boards 700.

According to certain embodiments, the first bracket 410 may be connected to the hinges 500 by the first hinge bracket 450. The printed circuit board 700 may be disposed on the first face 411 of the first bracket 410. According to an embodiment, the second bracket 420 may be connected to the hinges 500 by the second hinge bracket 460. The printed circuit board 700 may be disposed on the first face 421 of the second bracket 420.

According to certain embodiments, the first bracket 410 and the second bracket 420 may be foldably connected to each other by the hinges 500 and the hinge brackets 450 and 460. When the electronic device (e.g., the electronic device 101 in FIGS. 1 to 3) is in the folded state, the first face 411 of the first bracket 410 and the first face 421 of the second bracket 420 may face each other. When the electronic device 101 is in the unfolded state, the first face 411 of the first bracket 410 and the first face 421 of the second bracket 420 may be oriented in the same direction.

According to certain embodiments, the electronic device 101 may include one or more hinges 500. The one or more hinges 500 may be disposed inside the cover 330. The one or more hinges 500 may be arranged in the y-axis direction. The hinges 500 may be positionally fixed inside the cover 330, and may be disposed in the area corresponding to the folding area (e.g., the folding area 203 in FIGS. 2 and 3) of the display (e.g., the display 200 of FIG. 2 and FIG. 3). One or more printed circuit boards 700 may be disposed between the one or more hinges 500. Since the hinges 500 are able to be connected to the bracket 400 by the hinge brackets 450 and 460, the first bracket 410 and the second bracket 420 can be folded with the aid of the hinges 500.

According to certain embodiments, a first guide hole 451 and a third guide hole 453 may be formed in the first hinge bracket 450. A second guide hole 461 and a fourth guide hole 463 may be formed in the second hinge bracket 460. At least a portion of each of the printed circuit boards 700 may be inserted into each of the guide holes 451, 453, 461, and 463 to guide the movement of a portion of each of the printed circuit boards 700 when the electronic device 101 is folded. For example, at least a portion of a first printed circuit board 701 may be inserted into each of the first guide hole 451 formed in a first hinge bracket 450 and the second guide hole 461 formed in the second hinge bracket 460. At least a portion of a second printed circuit board 702 may be inserted into each of the third guide hole 453 formed in the first hinge bracket 450 and the fourth guide hole 463 formed in the second hinge bracket 460.

According to certain embodiments, the bracket assembly 40 may include one or more printed circuit boards 700. The printed circuit board 700 may be disposed in a direction (e.g., the x-axis direction) perpendicular to the folding axis (e.g., the y-axis direction). The printed circuit board 700 may cross the first bracket 410 and the second bracket 420 disposed on both sides of the hinge 500. The printed circuit boards 700 may be made of a flexible conductive material, so that damage due to the folding of the electronic device can be prevented. In certain embodiments, the extending direction of the printed circuit boards 700 is not necessarily limited to a direction (e.g., the x-axis direction) perpendicular to the folding axis.

According to certain embodiments, the printed circuit boards 700 may include a first printed circuit board 701 and a second printed circuit board 702. At least a portion of the first printed circuit board 701 may be exposed to each of the first face 411 of the first bracket 410 and the first face 421 of the second bracket 420 through each of the first guide hole 451 and the second guide hole 461. Similarly, at least a portion of the second printed circuit board 702 may be exposed to each of the first face 411 of the first bracket 410 and the first face 421 of the second bracket 420 through each of the third guide hole 453 and the fourth guide hole 463.

According to certain embodiments, the first bracket 410 may have a first opening 413 and the second bracket 420 may have a second opening 423. The first opening 413 and the second opening 423 may be disposed in a direction across the first bracket 410 and the second bracket 420 (e.g., in the x-axis direction). A hinge 500 may be disposed between the first opening 413 and the second opening 423. The first printed circuit board 701 may extend from the second face 412 of the first bracket 410 to the first face 411 of the first bracket 410 through the first opening 413. The first printed circuit board 701 extending to the first face 421 of the second bracket 420 may extend to the second face of the second bracket 420 through the second opening 423.

According to certain embodiments, the first bracket 410 may have a third opening 417 and the second bracket 420 may have a fourth opening 427. In certain embodiments, the fourth opening 427 may be a groove formed at an end of the first bracket 410. The third opening 417 and the fourth opening 427 may be disposed in a direction across the first bracket 410 and the second bracket 420 (e.g., in the x-axis direction). A hinge 500 may be disposed between the third opening 417 and the fourth opening 427. The second printed circuit board 702 may extend from the second face 412 of the first bracket 410 to the first face 411 of the first bracket 410 through the third opening 417. The second printed circuit board 702 extending to the first face 421 of the second bracket 420 may extend to the second face of the second bracket 420 through the fourth opening 427.

According to certain embodiments, the first printed circuit board 701 and the second printed circuit board 702 may be fixed to a first face 411 of the bracket 400. As described above, the first printed circuit board 701 and the second printed circuit board 702 may be primarily fixed by being inserted into the guide holes 451, 453, 461, and 463, and may be secondarily fixed by a position-fixing member formed on the printed circuit board 700 and a position-fixing member formed on the bracket 400.

Figure 7A:
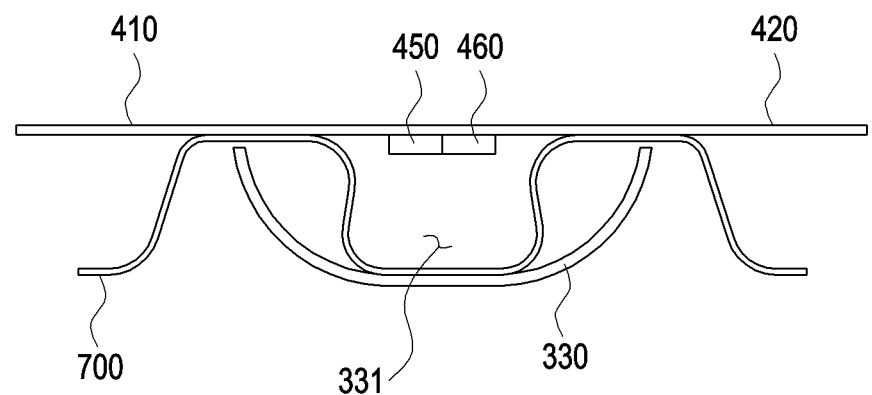
FIG. 7A is a simplified view illustrating a relationship between a printed circuit board and a cover of an electronic device according to embodiments in the state in which the electronic device is unfolded.
Figure 7B:
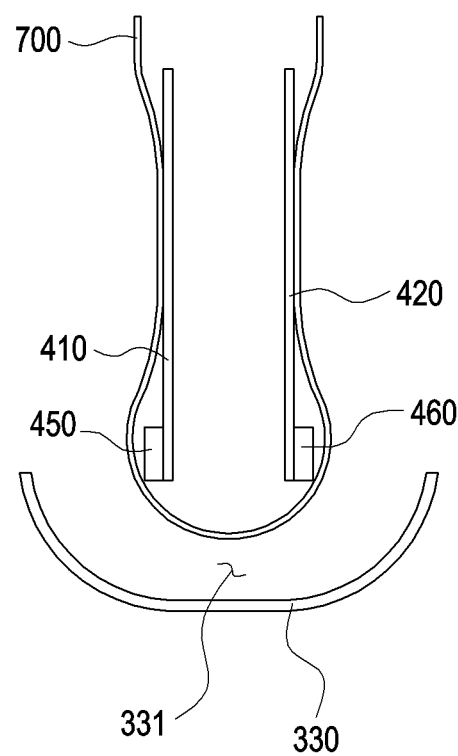
FIG. 7B is a simplified view illustrating a relationship between a printed circuit board and a cover of an electronic device according to embodiments in the state in which the electronic device is folded.

FIG. 7A is a simplified view illustrating a relationship between a printed circuit board and a cover of an electronic device according to embodiments in the state in which the electronic device is unfolded. FIG. 7B is a simplified view illustrating a relationship between a printed circuit board and a cover of an electronic device according to embodiments in the state in which the electronic device is folded.

Referring to FIG. 7A and FIG. 7B, an electronic device (e.g., the electronic device 101 in FIGS. 1 to 3) may include a first bracket (e.g., the first bracket 410 in FIG. 4), a second bracket (e.g., the second bracket 420 in FIG. 4), a first hinge bracket 450, a second hinge bracket 460, a cover 330, and a printed circuit board 700. All or some of the structures of the first bracket 410, the second bracket 420, the first hinge bracket 450, the second hinge bracket 460, the cover 330, and the printed circuit board 700 in FIGS. 7A and 7B may be the same as all or some of the structures of the first bracket 410, the second bracket 420, the first hinge bracket 450, the second hinge bracket 460, the cover 330, and the printed circuit board 700 illustrated in FIGS. 5 and 6.

According to certain embodiments, a portion of the printed circuit board 700 may be deformed depending on the folded state or the unfolded state of the electronic device.

Referring to FIG. 7A, in the unfolded state of the electronic device, the printed circuit board 700 may be extended and fixed to at least a portion of the first bracket 410 and a portion of the second bracket 420. Compared with the folded state of the electronic device, as an area of the printed circuit board 700 which faces the cover 330 (e.g., a cover section 700a in FIGS. 8B and 8C) decreases, the printed circuit board 700 may be disposed to have a relatively increased distance from the first bracket 410 and the second bracket 420. For example, at least a portion of the printed circuit board 700 may come in contact with the inner face of the cover 330. As another example, at least one area of the printed circuit board 700 may be maintained in the state of being spaced apart from the first hinge bracket 450 disposed at one end of the first bracket 410 and the second hinge bracket 460 disposed at one end of the second bracket 420.

Referring to FIG. 7B, in the folded state of the electronic device, the printed circuit board 700 may be extended and fixed to at least a portion of the first bracket 410 and a portion of the second bracket 420. Compared with the unfolded state of the electronic device, as an area of the printed circuit board 700 which faces the cover 330 (e.g., a cover section 700a in FIG. 8B and FIG. 8C) increases, the printed circuit board 700 may be become to be adjacent to the first bracket 410 and the second bracket 420. For example, the printed circuit board 700 may be spaced apart from the inner face of the cover 330 by a predetermined distance. As another example, at least one area of the printed circuit board 700 may be maintained in the state of being located adjacent to the first hinge bracket 450 disposed at one end of the first bracket 410 and the second hinge bracket 460 disposed at one end of the second bracket 420.

Figure 8A:
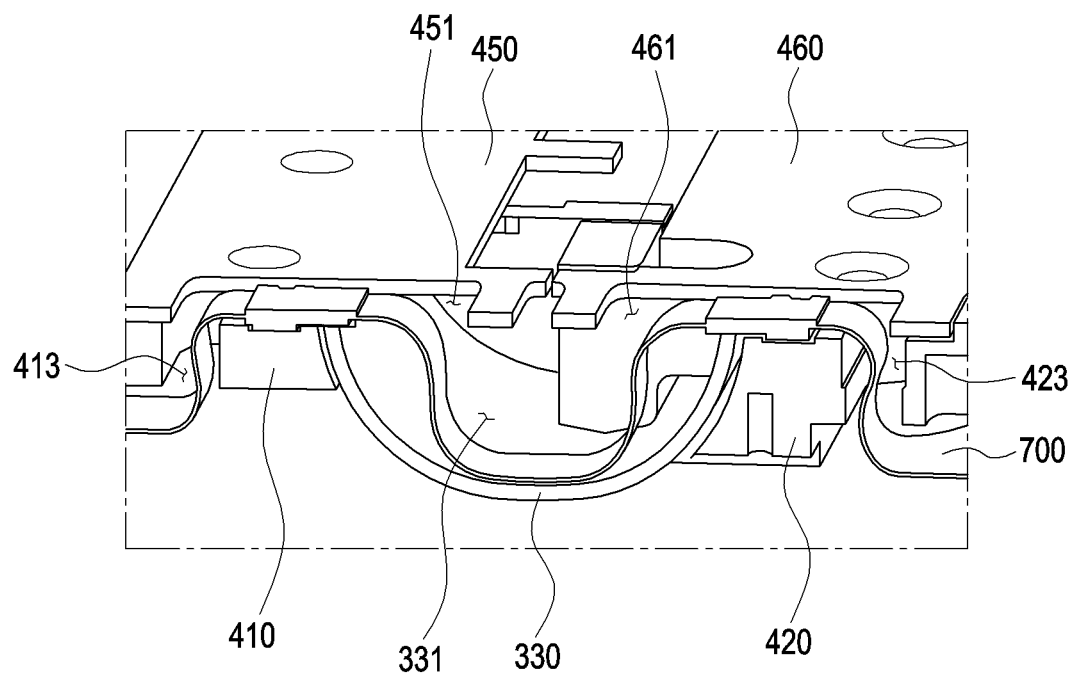
Figure 8B:
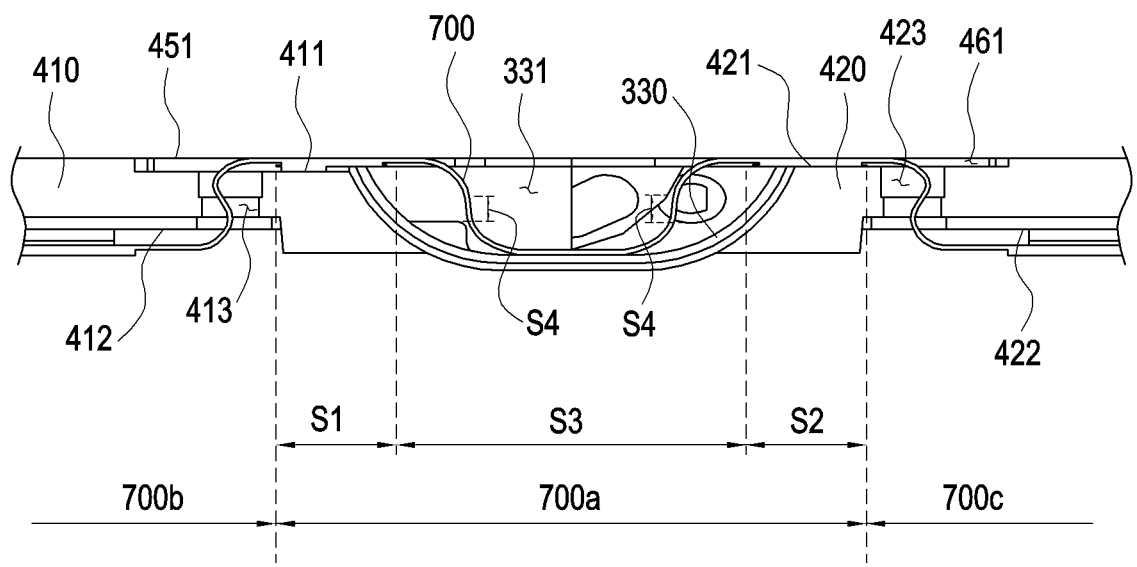
Figure 8C:
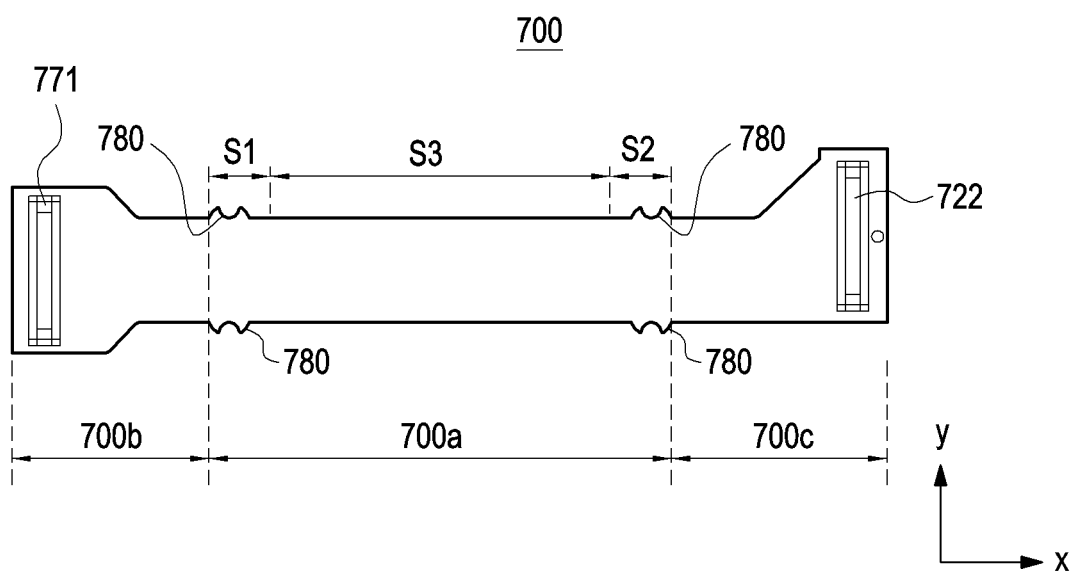

FIG. 8A, FIG. 8B, and FIG. 8C illustrate a printed circuit board of an electronic device according to certain embodiments. FIG. 8A is a view illustrating the state in which the printed circuit board is disposed in the inner space of a cover. FIG. 8B is a cross-sectional view of the printed circuit board. FIG. 8C is a front view illustrating the state in which the printed circuit board is unfolded.

Referring to FIG. 8A, FIG. 8B, and FIG. 8C, an electronic device (e.g., the electronic device 101 in FIGS. 1 to 3) may include a first bracket 410, a second bracket 420, a first hinge bracket 450, a second hinge bracket 460, a cover 330, and a printed circuit board 700. All or some of the structures of the first bracket 410, the second bracket 420, the first hinge bracket 450, the second hinge bracket 460, the cover 330, and the printed circuit board 700 in FIGS. 8A to 8C may be the same as all or some of the structures of the first bracket 410, the second bracket 420, the first hinge bracket 450, the second hinge bracket 460, the cover 330, and the printed circuit board 700 illustrated in FIGS. 5 and 6. Hereinafter, a printed circuit board 430 and a mounting structure of the printed circuit board 430 will be described with reference to FIG. 8A, FIG. 8B, and FIG. 8C.

According to certain embodiments, the printed circuit board 700 may extend from the first bracket 410 to the second bracket 420 across the cover 330. At least a portion of the printed circuit board 700 may be disposed in the inner space 331 of the cover 330. The printed circuit board 700 disposed in the inner space 331 of the cover 300 may extend to the first bracket 410 and the second bracket 420 through the guide holes 451 and 461 and the openings 413 and 423.

According to an embodiment, the printed circuit board 700 may extend from the second face 412 of the first bracket 410 to the first face 411 of the first bracket 410 through the first opening 413. The printed circuit board 430 extending to the first face 411 of the first bracket 410 may extend to the inner space 331 of the cover 330 through the first guide hole 451 of the first hinge bracket 450. The printed circuit board 430 extending to the inside of the cover 330 may extend to the first face 421 of the second bracket 420 through the second guide hole 461 of the second hinge bracket 460. The printed circuit board 430 extending to the first face 421 of the second bracket 420 may extend to the second face 422 of the second bracket 420 again through the second opening 423 of the second hinge bracket 420. Thereby, the printed circuit board 430 may be electrically connected to a main circuit board disposed on the second face 412 of the first bracket 410 and the second face 422 of the second bracket 420.

According to certain embodiments, the printed circuit board 700 may include a cover section 700a accommodated inside the cover 330, first and second connection sections 700b and 700c extending from the opposite sides of the cover section 700a.

According to an embodiment, connectors for electrical connection to the main circuit board of the electronic device 101 may be disposed at the opposite ends of the printed circuit board 700. For example, the first connection section 700b may include a first connector 771 that provides an electrical connection with a connector of a first main circuit board 610 (e.g., the first circuit board 610 in FIG. 4) disposed adjacent to the first bracket 410. The first connector 771 may be disposed on the second face 412 of the first bracket 410. As another example, the second connection section 700c may include a second connector 772 that provides an electrical connection with a connector of a second main circuit board 620 (e.g., the second circuit board 620 in FIG. 4) disposed adjacent to the second bracket 420. The second connector 772 may be disposed on the second face 422 of the second bracket 410.

According to an embodiment, the cover section 700a may be formed in different layers, and at least a portion thereof (e.g., a deformable area S3) may be deformed depending on the folded state or the unfolded state of the electronic device.

According to certain embodiments, the cover section 700a may include a first fixing area S1 extending from the first connection section 700b and fixing the printed circuit board 700 to the first bracket 410, a second fixing area S2 extending from the second connection area 700c and fixing the printed circuit board 700 to the second bracket 420, and the deformable area S3 disposed between the first fixing area S1 and the second fixing area S2. The first fixing area S1 may be formed to correspond to the second fixing area S2 with the deformable area S3 interposed therebetween. The deformable area S3 may be an area that forms a bending portion as the electronic device is folded or unfolded.

According to an embodiment, the first fixing area S1 may be attached to a portion of the first face 411 of the first bracket 410 located between the first opening 413 formed in the first bracket 410 and the inner space 331 of the cover 330. The second fixing area S2 may be attached to a portion of the first face 421 of the second bracket 420 located between the second opening 423 formed in the second bracket 420 and the inner space 331 of the cover 330.

According to an embodiment, the first fixing area S1 may include at least one position-fixing structure 780. For example, the position-fixing structure 780 may be formed at the upper end or the lower end of the first fixing area S1, and may be provided in the form of a fixing hole or a semi-circular fixing groove. In correspondence to this, the first face 411 of the first bracket 410 may be provided with a fixing protrusion, which is insertable into the fixing hole or the fixing groove. The second fixing area S2 may include at least one position-fixing structure 780. For example, the position-fixing structure 780 may be formed at the upper end or the lower end of the second fixing area S2, and may be provided in the form of a fixing hole or a semi-circular fixing groove. In correspondence to this, the first face 411 of the second bracket 420 may be provided with a fixing protrusion, which is insertable into the fixing hole or the fixing groove. However, the fixing grooves formed in the first fixing area S1 and/or the second fixing area S2 illustrated in the drawings are merely illustrative ones, and the fixing method is not limited to what is illustrated in the drawing. The disclosure may include various fixing methods for fixing the printed circuit board 700 to the bracket 400.

According to an embodiment, through the fixing structure 780, at least one portion of the flexible printed circuit board 700 may form a face which is not deformable. One face of the fastening structure 780 may maintain ground at the same level as the housing structures or brackets 410 and 420 of the electronic device, thereby reducing impedance variation.

According to an embodiment, the deformable area S3 is formed between the first fixing area S1 attached to the first bracket 410 and the second fixing area S2 attached to the second bracket 420. The deformable area S3 may be bent at a predetermined curvature in the inner space 331 of the cover 330. For example, the deformable area S3 may be disposed to be in contact with the inner face of the cover 330 when the electronic device is in the unfolded state. As another example, the deformable area S3 may be spaced apart from the inner face of the cover 330 by a predetermined distance when the electronic device is in the folded state.

According to an embodiment, the deformable area S3 may be different from the first fixing area S1 and/or the second fixing area S2 in terms of the number of stacked layers and length. For example, the deformable area S3 may be formed by stacking three conductive layers, and the first fixing area S1 and/or the second fixing area S2 may be formed by stacking five conductive layers. As another example, the longitudinal length of the deformable area S3 (e.g., the length arranged in the direction across the first bracket 410 and the second bracket 420 (e.g., in the x-axis direction)) may be relatively longer than that of the fixing area S1 and/or that of the second fixing area S2. However, the numbers of the stacked conductive layers and the lengths of the deformable area S3, the first fixing area S1, and/or the second fixing area S2 illustrated in the drawings are not limited to the illustrated ones, and may be variously designed depending on the types and the number of conductive lines disposed therein.

According to an embodiment, the deformable area S3 may include a linear area S4, at least a portion of which is formed in the linear form (e.g., in the form of a flat face). The linear area S4 may protect the printed circuit board 700. For example, when the hinge 300 rotates, the linear area S4 may prevent the printed circuit board 700 from being damaged by the hinge bracket 450 or 460 that moves to the inner space 331 of the cover 330.

Figure 9:
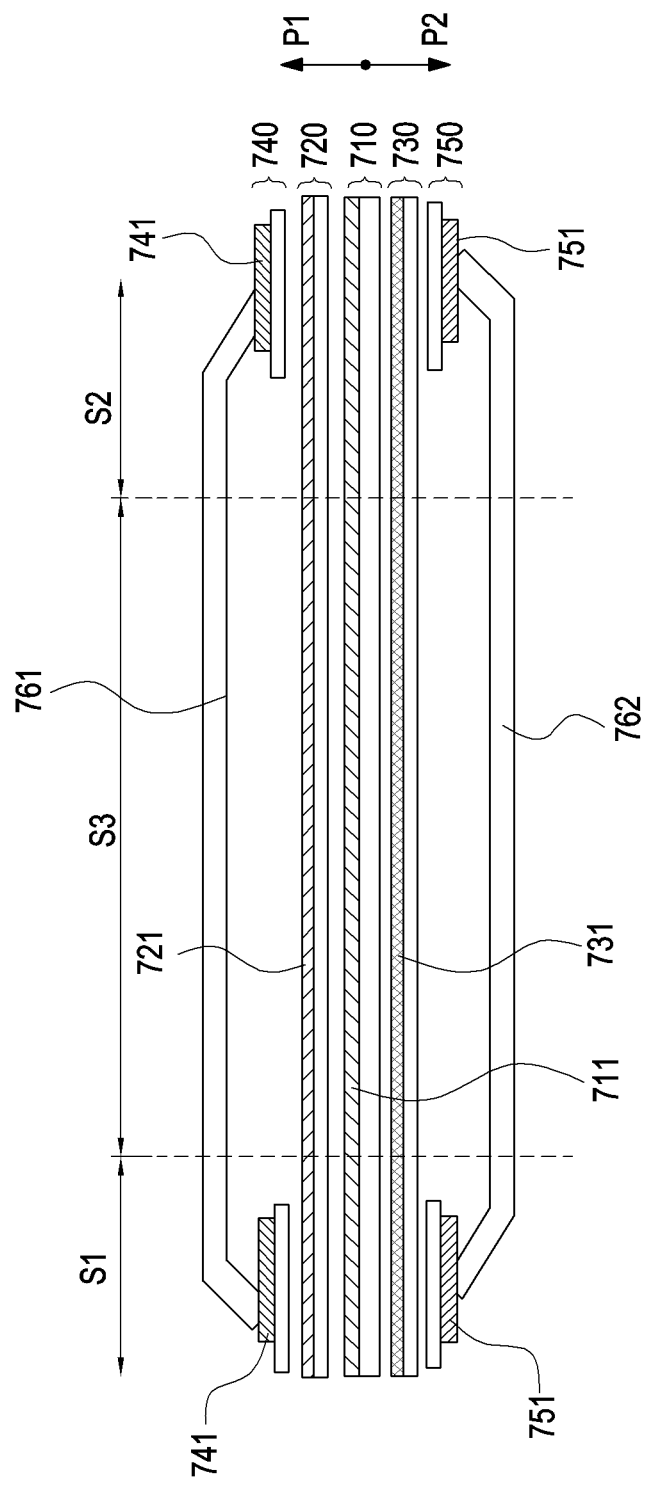
FIG. 9 is a view illustrating a cross section of a printed circuit board disposed within an electronic device according to certain embodiments.

FIG. 9 is a view illustrating a cross section of a flexible printed circuit board disposed within an electronic device according to certain embodiments.

According to certain embodiments, an electronic device (e.g., the electronic device 101 in FIGS. 1 to 3) may include a flexible printed circuit board 700, and the flexible printed circuit board 700 may include a first connection section (the first connection section 700b in FIG. 8C) connected to a first main circuit board (e.g., the first circuit board 610 in FIG. 4), a second connection section (e.g., the second connection section 700c in FIG. 8C) connected to a second main circuit board (e.g., the second circuit board 620 of FIG. 4), and a cover section 700a disposed between the first connection section 700b and the second connection section 700c.

Referring to FIG. 9, the cover section 700a may include a first fixing area S1 extending from the first connection section 700b and fixing the printed circuit board 700 to the first bracket 410, a second fixing area S2 extending from the second connection area 700c and fixing the printed circuit board 700 to the second bracket 420, and the deformable area S3 disposed between the first fixing area S1 and the second fixing area S2. The deformable area S3 may be an area that forms a bending portion as the electronic device is folded or unfolded (e.g., from the unfolded operation to the folded operation). All or part of the structure of the first fixing area S1, the second fixing area S2, and the deformable area S3 in FIG. 9 may be the same as all or part of the structure of the first fixing area S1, the second fixing area S2, and the deformable area S3 in FIG. 8A, FIG. 8B, and FIG. 8C.

According to certain embodiments, the flexible printed circuit board 700 may have a multilayer structure. In the printed circuit board 700, the number of conductive layers in the stacked structures forming the first fixing area S1 and the second fixing area S2 may be different from the number of conductive layers in the stacked structure forming the deformable area S3. Hereinafter, the direction in which the display (e.g., the display 200 in FIGS. 2 and 3) of the electronic device 101 is disposed will be referred to as a "direction P1", and the direction in which the cover 330 of the electronic device is disposed will be referred to as a "direction P2".

According to certain embodiments, the deformable area S3 of the printed circuit board 700 may include a total of three conductive layers (e.g., a first conductive layer 710, a second conductive layer 720 stacked on the first conductive layer 710 in the direction P1, and a third conductive layer 730 stacked on the first conductive layer 710 in the direction P2). Air gaps may be formed between the first conductive layer 710 and the second conductive layer 720 and the third conductive layer 730. However, the deformable area S3 composed of the three conductive layers is merely an illustrative one, and the design thereof may be changed to include more conductive layers.

According to certain embodiments, the first fixing area S1 of the printed circuit board 700 may include a total of five conductive layers (e.g., a first conductive layer 710, a second conductive layer 720, a third conductive layer 730, a fourth conductive layer 740, and a fifth conductive layer 750). The first conductive layer 710 of the first fixing area S1 may extend from the first conductive layer 710 of the deformable area S3. The second conductive layer 720 stacked on the first conductive layer 710 in the direction P1 in the first fixing area S1 and the third conductive layer 720 stacked on the first conductive layer 710 in the P2 direction in the first fixing area S1 may extend from the second conductive layer 720 and the third conductive layer 730 of the deformable region S3, respectively. The fourth conductive layer 740 may be stacked on the second conductive layer 720 in the direction P1, and the fifth conductive layer 750 may be stacked on the third conductive layer 730 in the direction P2. Each of the fourth conductive layer 740 and the fifth conductive layer 750 may be provided with one of shielding films 761 and 762 disposed above and below the printed circuit board 700 and an area for grounding.

According to certain embodiments, the second fixing area S2 of the printed circuit board 700 may include a total of five conductive layers (e.g., a first conductive layer 710, a second conductive layer 720, a third conductive layer 730, a fourth conductive layer 740, and a fifth conductive layer 750). The first conductive layer 710 of the second fixing area S2 may extend from the first conductive layer 710 of the deformable area S3. The second conductive layer 720 stacked on the first conductive layer 710 in the direction P1 in the second fixing area S2 and the third conductive layer 730 stacked on the first conductive layer 710 in the P2 direction may extend from the second conductive layer 720 and the third conductive layer 730 of the deformable region S3, respectively. The fourth conductive layer 740 may be stacked on the second conductive layer 720 in the direction P1, and the fifth conductive layer 750 may be stacked on the third conductive layer 730 in the direction P2. Each of the fourth conductive layer 740 and the fifth conductive layer 750 may be provided with one of shielding films 761 and 762 disposed on above and below the printed circuit board 700 and an area for grounding. An air gap may be formed between each two adjacent layers of the first conductive layer 710, the second conductive layer 720, the third conductive layer 730, the fourth conductive layer 740, and the fifth conductive layer 750. However, the first fixing area S1 and the second fixing area S2 each composed of the five conductive layers are merely illustrative ones, and the design thereof may be changed to include more conductive layers.

According to certain embodiments, in the deformable area S3 of the printed circuit board 700, the first conductive layer 710 and the third conductive layer 730 may be stacked in the direction P2 with respect to the second conductive layer 720 so as to form a build-up layer. In the first fixing area S1 and the second fixing area S2 of the printed circuit board 700, the second conductive layer 720, the first conductive layer 710, the third conductive layer 730, and the fifth conductive layer 750 are stacked in the direction P2 with respect to the fourth conductive layer 740 so as to form a build-up layer. For example, the printed circuit board 700 may be made of a laminate having metal plates (e.g., copper (Cu) on at least one face of a polyimide (PI)-based substrate layer, such as a Flexible Copper Clad Laminate (FCCL). As another example, except for the fifth conductive layer 750 of the first fixing area S1 and the second fixing area S2, as the first to fourth conductive layers 740, thin copper plates may be stacked on one face of a PI-based substrate layer, which is oriented in the direction P1, and a plated copper foil may be stacked thereon. According to an embodiment, as the fifth conductive layer 750 of the first fixing area S1 and the second fixing area S2, a thin copper plate may be stacked on one face of a PI-based substrate layer substrate layer, which is oriented in the direction P2, and a plated copper foil may be stacked thereon. In order to facilitate bending in the cover 330 according to the folded state or the unfolded state of the electronic device, copper foils (e.g., a first conductive line 711, a second conductive line 721, and a third conductive line 731) may be disposed in the first to fourth conductive layers 740 so as to be oriented in the direction P1. The fourth conductive layer 740 may be provided with a shielding film 761 or 762 disposed above the printed circuit board 700 and a copper foil disposed to be oriented in the direction P1 for grounding. The fifth conductive layer 750 may be provided with a shielding film 761 or 762 disposed below the printed circuit board 700 and a copper foil disposed to be oriented in the direction P2 for grounding. As another example, an ink layer may be laminated to coat the upper face of the plated copper foil circuit, thereby protecting the printed circuit board.

According to certain embodiments, at least one conductive line may be disposed in each of the multiple conductive layers forming the deformable area S3 of the printed circuit board 700. According to an embodiment, in the first conductive layer 710, a first conductive line 711 forming a ground may be disposed. For example, the first conductive layer 710 may provide a ground plane of the second conductive line 721. The first conductive line 711 may be disposed on one face of the first conductive layer 710, which is oriented in the direction P1, so as to have a mesh shape. The first conductive line 711 may be electrically connected to a ground member (e.g., a ground plane of a metal material) disposed within the first housing structure (e.g., the first housing 310 in FIG. 4) or the second housing (e.g., the second housing 320 in FIG. 4) to provide the entire first conductive layer 710 as a ground layer. The first conductive layer 710 on which the first conductive line 711 is formed may be disposed relatively closer to the cover 330 than the second conductive layer 720 so that it is possible to reduce impedance variation occurring in the state in which the electronic device 101 is unfolded. As another example, in the unfolded state of the electronic device 101, the first conductive line 711 is disposed on the face of the first conductive layer 710, which is oriented in the direction P1, so that the first conductive layer 710 may not be exposed when viewed from the second face of the first housing structure (e.g., the second face of the first housing 310 in FIG. 2) and the fourth face of the second housing (e.g., the second face of the second housing 320 in FIG. 2). As another example, the first conductive line 711 may be formed on only one face of the second conductive layer 720 to provide a flexible curved face in the folding operation of the electronic device 101.

According to an embodiment, in the second conductive layer 720, at least one second conductive line 721 may be disposed to be oriented in the direction P1 relative to the first conductive line 711. The second conductive line 721 may be connected to an electronic component disposed in the electronic device. For example, the second conductive line 721 may be electrically connected to at least one of a camera and a display (e.g., the display 200 in FIG. 2). As another example, the second conductive line 721 may include multiple wiring lines disposed to be spaced apart from each other, and each of the wiring lines may include an impedance wiring line (e.g., an antenna signal wiring line). The impedance wiring line may provide signals for matching of signals of a circuit component. The signals for matching may be signals (e.g., RF signals) having phase differences of (+) and (−) of, for example, a Mobile Industry Processor Interface (MIPI), a Universal Serial Bus (USB), a Peripheral Component Interconnect Express (PCIE), or a DDR. As another example, the MIPI may have an electrical resistance of about 100 ohms as a signal for matching, the USB may have an electrical resistance of about 90 ohms as a signal for matching, and the RF may have an electrical resistance of about 50 ohms as a signal for matching. The second conductive layer 720 on which the second conductive line 721 is formed is disposed relatively farther away from the cover 330 compared to the first conductive layer 710, so that it is possible to reduce impedance variation occurring upon contact with the cover 330 in the state in which the electronic device 101 is unfolded. Thus, it is possible to provide a stable impedance flow regardless of whether the electronic device 101 is in the unfolded state or in the folded state. As another example, in the unfolded state of the electronic device 101, the second conductive line 721 is disposed on the face of the second conductive layer 720, which is oriented in the direction P1, so that the first conductive layer 710 may not be exposed when viewed from the second face of the first housing structure (e.g., the second face of the first housing 310 in FIG. 2) and the fourth face of the second housing (e.g., the fourth face of the second housing 320 in FIG. 2). As another example, the second conductive line 721 may be formed on only one face of the second conductive layer 720 to provide a flexible curved face in the folding operation of the electronic device 101.

According to an embodiment, in the third conductive layer 730, a third conductive line 731 may be disposed to be oriented in the direction P2 relative to the first conductive line 711. The third conductive line 731 may be connected to an electronic component disposed in the electronic device. For example, the third conductive line 731 may be electrically connected to a processor (e.g., the processor 120 in FIG. 1). As another example, the third conductive line 731 may include multiple wiring lines disposed to be spaced apart from each other, and each of the wiring lines may include a general circuit wiring line. Unlike the second conductive line 721, the general circuit wiring lines may include wiring lines, which do not require matching of signals, such as a power wiring line, a control signal wiring line (e.g., I2C, I2S, or Reset), and the like. In the unfolded state of the electronic device 101, the third conductive line 731 is disposed on the face of the third conductive layer 730, which is oriented in the direction P1, so that the first conductive layer 710 may not be exposed when viewed from the second face of the first housing structure (e.g., the second face of the first housing 310 in FIG. 2) and the fourth face of the second housing (e.g., the fourth face of the second housing 320 in FIG. 2). As another example, the third conductive line 731 may be formed on only one face of the third conductive layer 730 to provide a flexible curved face in the folding operation of the electronic device 101.

According to certain embodiments, the fourth conductive layer 740 and the fifth conductive layer 750, which form the first fixing area S1 and the second fixing area S2 of the flexible printed circuit board 700, may be provided with one or more ground wiring lines 741 and 751. The fourth conductive layer 740 and the fifth conductive layer 750 formed in the first fixing area S1 and the fourth conductive layer 740 and the fifth conductive layer 750 formed in the second fixing area may form substantially the same layers and the same structures. According to an embodiment, a first grounding wiring line 741 may be disposed in the fourth conductive layer 740 in the direction P1, and may be in contact with a portion of the first shielding film 761 stacked on the fourth conductive layer 740 in the direction P1. According to an embodiment, a second grounding wiring line 751 may be disposed in the fifth conductive layer 750 in the direction P2, and may be in contact with a portion of the second shielding film 762 stacked on the fifth conductive layer 750 in the direction P2.

Figure 10A:
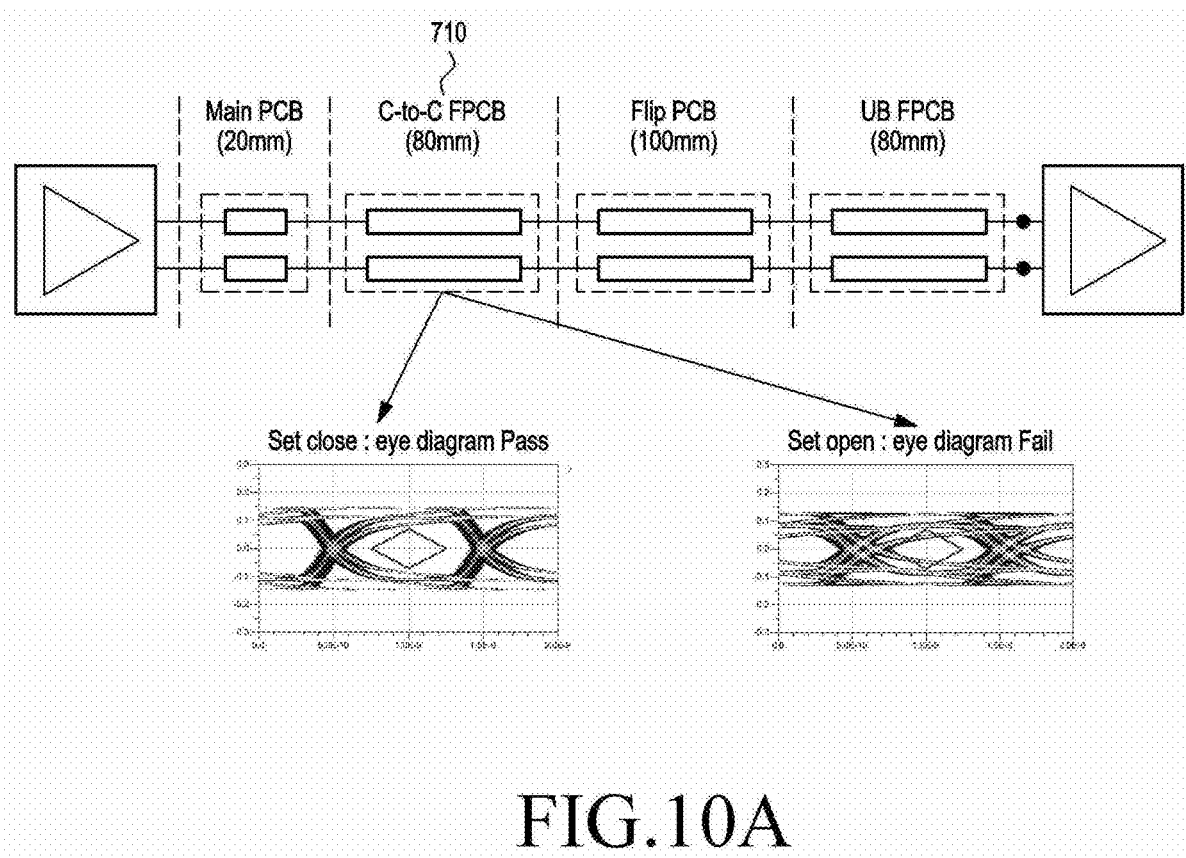
FIG. 10A is a view illustrating eye diagrams of a printed circuit board in a conventional foldable electronic device.
Figure 10B:
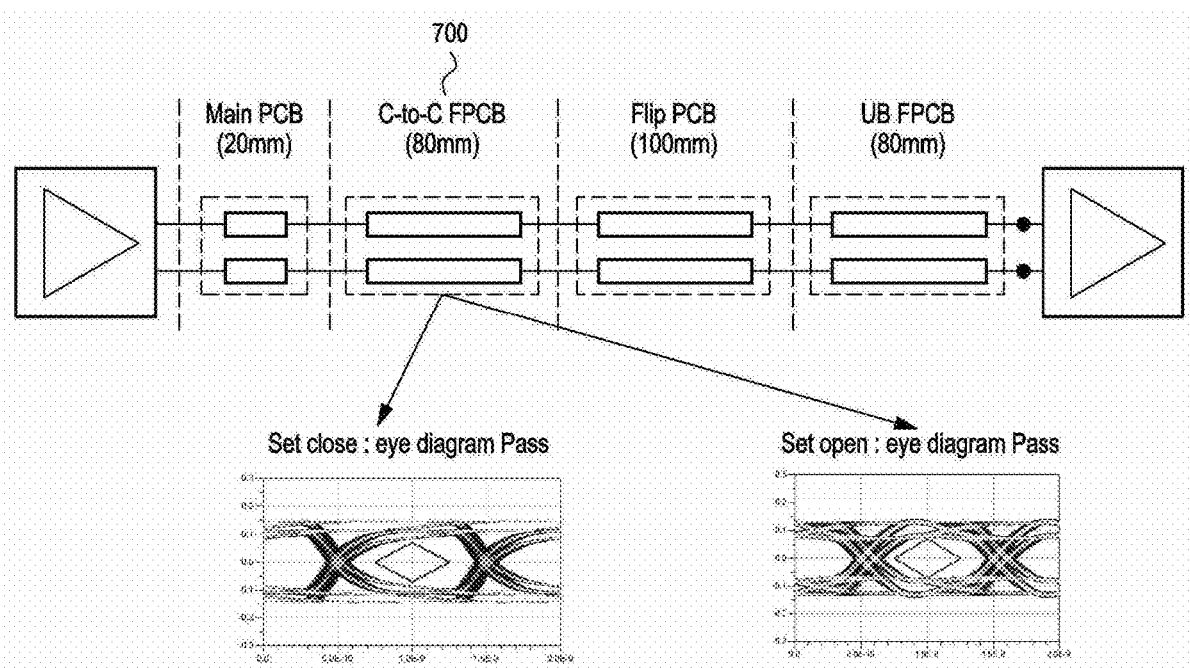
FIG. 10B is view illustrating eye diagrams of a printed circuit board in an electronic device according to an embodiment of the disclosure.

FIG. 10A and FIG. 10B are views each illustrating eye diagrams in an electronic device to which a flexible printed circuit board is applied, according to certain embodiments. FIG. 10A is a view illustrating eye diagrams of a flexible printed circuit board in a conventional foldable electronic device, and FIG. 10B is a view illustrating eye diagrams of a flexible printed circuit board in an electronic device according to an embodiment of the disclosure.

According to certain embodiments, an electronic device (e.g., the electronic device 101 in FIGS. 1 to 3) may include a printed circuit board 700, and all or part of the structure of the printed circuit board 700 of FIG. 10B may be the same as the structure of the printed circuit board 700 of FIGS. 5 to 9.

Referring to FIG. 10A, the drawing shows that eye diagrams according to the folded state and the unfolded state of the foldable electronic device 101 do not uniformly appear. The eye diagrams are for identifying data transmission characteristics in a transmission system such as a printed circuit board. For example, when the distance between an eye pattern and a linear or nonlinear line is long, it may indicate the case in which there is no interference with the noise of a signal, and when the distance between the eye pattern and the linear or nonlinear line is small or the eye pattern and the linear or nonlinear line overlap, it may indicate the case in which there is severe interference with the noise of a signal.

According to an embodiment, it can be seen that when the foldable electronic device is in the folded state, since the cover 330 and one area (e.g., the deformable area) of the printed circuit board (e.g., a printed circuit board 70 according to a comparative example) facing the cover 330 are disposed to be spaced apart from each other, the eye patterns of the eye diagrams clearly appear. Unlike this, it can be seen that when the foldable electronic device is in the unfolded state, since the cover 330 and one area (e.g., the deformable area) of the printed circuit board (e.g., a printed circuit board 70 according to a comparative example) facing the cover 330 are disposed to be in contact with each other, many interference lines overlap the eye patterns of the eye diagrams. This is resulted from the fact that since an area of the printed circuit board 70 comes into contact with the metal cover 330, a change occurs due to impedance distortion, and thus data transmission characteristics are deteriorated.

Referring to FIG. 10B, the drawing shows that eye diagrams according to the folded state and the unfolded state of the foldable electronic device 101 of the disclosure uniformly appear. According to an embodiment, it can be seen that when the foldable electronic device 101 is in the folded state, since the cover 330 and one area (e.g., the deformable area) of the printed circuit board 700 facing the cover 330 are disposed to be spaced apart from each other, the eye patterns of the eye diagrams clearly appear. In addition, it can be seen that when the foldable electronic device is in the unfolded state, even in the case in which the cover 330 and one area (e.g., the deformable area) of the printed circuit board 700 facing the cover 330 are disposed to be in contact with each other, the eye patterns of the eye diagrams clearly appear. According to the structure of the printed circuit board 700 according to the disclosure, even when the deformable area S3 is brought into contact with the metal cover 330, impedance distortion does not occur, so that it is possible to provide improved data transmission characteristics.

An electronic device (e.g., the electronic device 101 in FIGS. 1 to 4) according to certain embodiments may include a foldable housing. The foldable housing may include: a hinge structure (e.g., the hinge structure 500 in FIG. 5); a first housing structure (e.g., the first housing 310 in FIGS. 2 to 4) connected to the hinge structure and including a first face oriented in a first direction, and a second face oriented in a second direction opposite the first direction; and a second housing (e.g., the second housing 320 in FIGS. 2 to 4) connected to the hinge structure and including a third face oriented in a third direction, and a fourth face oriented in a fourth direction opposite the third direction, the second housing being folded with the first housing about the hinge structure. In the folded state of the foldable housing, the first face may face the third face, and in the unfolded state of the foldable housing, the third direction may be a same as the first direction. The electronic device may include a flexible display (e.g., the display 200 in FIG. 2) extending from the first face to the third face, a processor (e.g., the processor 120 in FIG. 1) disposed in the first housing structure or the second housing, at least one camera disposed in the first housing structure or the second housing, a first ground member disposed in the first housing structure or the second housing, and a Flexible Printed Circuit Board (FPCB) (e.g., the printed circuit board 700 in FIGS. 8A to 8C) extending from the first housing structure to the second housing across the hinge structure, and including a bending portion (e.g., the deformable area S2 in FIG. 8C) in the hinge structure. In the unfolded state, the bending portion of the printed circuit board may include at least one first conductive line (e.g., the first conductive line 711 in FIG. 9) that forms a ground on a first layer (e.g., the first conductive layer 710 in FIG. 9), at least one second conductive line (e.g., the second conductive line 721 in FIG. 9) disposed on a second layer (e.g., the second conductive layer 720 in FIG. 9) disposed between the display and the first layer, and at least one third conductive line (e.g., the third conductive line 731 in FIG. 9) provided on a third layer (e.g., the third conductive layer 730 in FIG. 9) disposed on a side opposite a side on which the second layer is disposed with reference to the first layer. The first conductive line may be electrically connected to the first ground member, the second conductive line may be connected to at least one of the camera and the display, and the third conductive line may be electrically connected to the processor.

According to certain embodiments, the first conductive line may include a mesh shape on the first layer.

According to certain embodiments, the hinge structure may include a metal material. According to certain embodiments, the electronic device may further include a Radio Frequency (RF) circuit, which may be electrically connected to the first conductive line.

According to certain embodiments, the electronic device may further include a Power Management Integrated Circuit (PMIC), which may be electrically connected to the third conductive line.

According to certain embodiments, the display may be disposed to face a hinge of a hinge cover (e.g., the hinge cover 330 in FIGS. 7A and 7B) with the FPCB interposed therebetween, and the first conductive line, the second conductive line, and the third conductive line may be disposed to face the display.

According to certain embodiments, the display is disposed to face a hinge cover of the hinge with the FPCB interposed therebetween, and the FPCB may include a hinge cover section (e.g., the hinge cover section 700*a* in FIG. 8C) accommodated in the hinge cover, a first connection section (e.g., the first connection section 700*b* in FIG. 8C) extending to a first side of the hinge cover section, and a second connection section (e.g., the second connection section 700*c* in FIG. 8C) extending to a second side of the hinge cover section.

According to certain embodiments, the first connection section may include a first connector (e.g., the first connector 771 in FIG. 8C) that provides an electrical connection with a connector of a first main circuit board (e.g., the first circuit board 610 in FIG. 4) disposed in the first housing structure, and the second connection section may include a second connector (e.g., the second connector 772 in FIG. 8C) that provides an electrical connection with a connector of a second main circuit board (e.g., the second circuit board 620 in FIG. 4) disposed in the second housing.

According to certain embodiments, the electronic device may further include a first bracket (e.g., the first bracket 410 in FIG. 4) disposed in the first housing structure and a second bracket (e.g., the second bracket 420 in FIG. 4) disposed in the second housing. The hinge cover section may include a first fixing area (e.g., the first fixing area S1 in FIG. 8C) extending from the first connection section and configured to fix an area of the FPCB to the first bracket, a second fixing area (e.g., the second fixing area S2 in FIG. 8C) extending from the second connection section and configured to fix another area of the FPCB to the second bracket, and a deformable area (e.g., the deformable area S3 in FIG. 8C) disposed between the first fixing area and the second fixing area.

According to certain embodiments, the number of multiple conductive layers forming the first fixing area and the number of conductive layers forming the second fixing area may be equal to each other, and the number of multiple conductive layers forming the deformable area and the number of multiple conductive layers forming the first fixing area may be different from each other.

According to certain embodiments, the deformable area of the FPCB may include the first layer (e.g., the first conductive layer 710 in FIG. 9) in which the first conductive line is disposed and which includes a mesh shape, the second layer (e.g., the second conductive layer 720 in FIG. 9) in which the second conductive line is disposed, and the third layer (e.g., the third conductive layer 730 in FIG. 9) in which the third conductive line is disposed.

According to certain embodiments, at least one of the first fixing area and the second fixing area of the FPCB may include the first, second, and third layers extending from the deformable area, and may also include a fourth layer (e.g., the fourth conductive layer 740 in FIG. 9) stacked on a face of the second layer to face the display and including a first ground wiring line (e.g., the first ground wiring line 741 in FIG. 9), and a fifth layer (e.g., the fifth conductive layer 750 in FIG. 9) stacked on a face of the third layer to face the hinge cover and including a second ground wiring line (e.g., the second ground wiring line 751 in FIG. 9).

According to certain embodiments, the first ground wiring line may be disposed to face the display, and may form a ground area with a first shielding film (e.g., the first shielding film 761 in FIG. 9), and a second ground wiring line may be disposed to face the hinge cover, and may form a ground area with a second shielding film (e.g., the second shielding film 762 in FIG. 9).

According to certain embodiments, at least one of the first fixing area and the second fixing area of the FPCB may include a fixing structure (e.g., the fixing structure 780 in FIG. 8C) disposed at an upper end portion or a lower end portion thereof so as to be fixed to the first bracket or the second bracket.

According to certain embodiments, the first fixing area of the FPCB may be disposed to be substantially in contact with a face of the first bracket by the fixing structure so as to form a flat face, and may be connected to a ground plane of the first housing structure. The second fixing area of the FPCB may be disposed to be substantially in contact with a face of the second bracket by the fixing structure so as to form a flat face, and may be connected to a ground plane of the second housing.

According to certain embodiments, the deformable area of the FPCB may include a linear area, at least a portion of which is formed as a flat face.

An electronic device according to certain embodiments may include: a hinge cover configured to cover a hinge structure; a first housing structure connected to the hinge structure and including a first main circuit board; a second housing connected to the hinge structure and including a second main circuit board, the second housing being configured to be rotatable relative to the first housing structure about the hinge structure; a flexible display extending from a face of the first housing structure to a face of the second housing and disposed to face the hinge cover; and a Flexible Printed Circuit Board (FPCB) extending from the first housing structure to the second housing across the hinge, and disposed between the flexible display and the hinge cover, the FPCB including a bending portion. The FPCB may include a first conductive layer in which a first conductive line forming a ground is disposed, a second conductive layer including a second conductive line disposed between the flexible display and the first conductive line, and a third conductive layer including a third conductive line disposed on a side opposite a side on which the second conductive line is disposed with reference to the first conductive line. The first conductive line may be electrically connected to a ground plane formed in the first housing structure or the second housing, and the second conductive line may include an antenna signal line.

According to certain embodiments, the electronic device may further include a first bracket disposed in the first housing structure and a second bracket disposed in the second housing. The FPCB may include a first fixing area configured to fix an area of the FPCB to the first bracket, a second fixing area configured to fix another area of the FPCB to the second bracket, and a deformable area disposed between the first fixing area and the second fixing area.

According to certain embodiments, at least one of the first fixing area and the second fixing area of the flexible printed circuit board may include a fourth conductive layer stacked on a face of the second conductive layer to face the display and including a first ground wiring line, and a fifth conductive layer stacked on a face of the third conductive layer to face the hinge cover and including a second ground wiring line.

According to certain embodiments, the first conductive line, the second conductive line, the third conductive line, and the first ground wiring line may be disposed to face the display, and the second ground wiring line may be disposed to face opposite the display.

A foldable electronic device according to certain embodiments may include a display, a hinge cover configured to cover a hinge structure, and a flexible printed circuit board disposed between the display and the hinge cover. The flexible printed circuit board may include a hinge cover section accommodated in the hinge cover, a first connection section extending to a first side of the hinge cover section, and a second connection section extending to a second side of the hinge cover section. The hinge cover section may include a first fixing area extending from the first connection section and configured to fix an area of the flexible printed circuit board to the electronic device, a second fixing area extending from the second connection section and configured to fix another area of the flexible printed circuit board to the electronic device, and a deformable area disposed between the first fixing area and the second fixing area. The number of multiple conductive layers forming the first fixing area and the number of conductive layers forming the second fixing area may be equal to each other, and the number of multiple conductive layers forming the deformable area and the number of multiple conductive layers forming the first fixing area may be different from each other.

While the disclosure has been shown and described with reference to certain embodiments thereof, it will be apparent to those skilled in the art that the electronic device according to the disclosure is not limited to these embodiments, and various changes in form and details may be made therein without departing from the spirit and scope of the disclosure as defined by the appended claims.

What is claimed is:

1. An electronic device comprising:
   a foldable housing including:
   a hinge structure,
   a first housing connected to the hinge structure and including a first face oriented in a first direction, and a second face oriented in a second direction opposite to the first direction, and
   a second housing connected to the hinge structure and including a third face oriented in a third direction, and a fourth face oriented in a fourth direction opposite to the third direction, the second housing being connected to the hinge structure allowing the second housing rotate about the first housing,
   wherein, when the foldable housing is folded, the first face faces the third face, and when the foldable housing is unfolded, the third direction is a same as the first direction;
   a flexible display extending from the first face to the third face;
   a processor disposed in the first housing or the second housing;
   at least one camera disposed in the first housing or the second housing;
   a first ground member disposed in the first housing or the second housing; and
   a Flexible Printed Circuit Board (FPCB) extending from the first housing to the second housing across the hinge structure, and including a bending portion in the hinge structure,
   wherein, when the foldable housing is unfolded, the bending portion includes:
   at least one first conductive line that forms a ground on a first layer,
   at least one second conductive line disposed on a second layer disposed between the flexible display and the first layer, and
   at least one third conductive line provided on a third layer disposed on a side opposite a side on which the second layer is disposed with reference to the first layer, and
   wherein the first conductive line is electrically connected to the first ground member, the second conductive line is connected to at least one of the camera and the flexible display, and the third conductive line is electrically connected to the processor.

2. The electronic device of claim 1, wherein the first conductive line includes a mesh shape on the first layer.

3. The electronic device of claim 1, wherein the hinge structure includes a metal material.

4. The electronic device of claim 1, further comprising:
   a Radio Frequency (RF) circuit, which is electrically connected to the first conductive line.

5. The electronic device of claim 1, further comprising:
   a Power Management Integrated Circuit (PMIC), which is electrically connected to the third conductive line.

6. The electronic device of claim 1, wherein the flexible display is disposed to face a hinge of a hinge cover with the FPCB interposed therebetween, and
   wherein the FPCB includes:
   a hinge cover section accommodated in the hinge cover,
   a first connection section extending to a first side of the hinge cover section, and
   a second connection section extending to a second side of the hinge cover section.

7. The electronic device of claim 6, wherein the first connection section includes a first connector that provides an electrical connection with a connector of a first main circuit board disposed in the first housing, and
   wherein the second connection section includes a second connector that provides an electrical connection with a connector of a second main circuit board disposed in the second housing.

8. The electronic device of claim 6, further comprising:
   a first bracket disposed in the first housing and a second bracket disposed in the second housing,
   wherein the hinge cover section includes:

a first fixing area extending from the first connection section and configured to fix an area of the FPCB to the first bracket, a second fixing area extending from the second connection section and configured to fix another area of the FPCB to the second bracket, and a deformable area disposed between the first fixing area and the second fixing area.

9. The electronic device of claim 8, wherein a number of multiple conductive layers forming the first fixing area and a number of multiple conductive layers forming the second fixing area are equal to each other, and wherein a number of multiple conductive layers forming the deformable area and the number of multiple conductive layers forming the first fixing area are different from each other.

10. The electronic device of claim 9, wherein the deformable area includes:

the first layer in which the first conductive line is disposed, the first layer including a mesh shape, the second layer in which the second conductive line is disposed, and the third layer in which the third conductive line is disposed.

11. The electronic device of claim 9, wherein at least one of the first fixing area and the second fixing area includes:

the first, second, and third layers extending from the deformable area, a fourth layer stacked on a face of the second layer to face the flexible display, the fourth layer including a first ground wiring line, and a fifth layer stacked on a face of the third layer to face the hinge cover, the fifth layer including a second ground wiring line.

12. The electronic device of claim 11, wherein a first ground wiring line is disposed to face the flexible display, and forms a ground area with a first shielding film, and wherein a second ground wiring line is disposed to face the hinge cover, and forms a ground area with a second shielding film.

13. The electronic device of claim 9, wherein at least one of the first fixing area and the second fixing area include a fixing structure disposed at an upper end portion or a lower end portion thereof so as to be fixed to the first bracket or the second bracket.

14. The electronic device of claim 13, wherein the first fixing area is disposed to be substantially in contact with a face of the first bracket by the fixing structure so as to form a flat face, and is connected to a ground plane of the first housing, and wherein the second fixing area is disposed to be substantially in contact with a face of the second bracket by the fixing structure so as to form a flat face, and is connected to a ground plane of the second housing.

15. The electronic device of claim 8, wherein the deformable area has a linear area, at least a portion of which is formed as a flat face.

16. An electronic device comprising:

a hinge cover configured to cover a hinge structure;

a first housing connected to the hinge structure and including a first main circuit board;

a second housing connected to the hinge structure and including a second main circuit board, the second housing being rotatable about the first housing;

a flexible display extending from a face of the first housing to a face of the second housing and disposed to face the hinge cover; and a Flexible Printed Circuit Board (FPCB) extending from the first housing to the second housing across the hinge structure, and disposed between the flexible display and the hinge cover, the FPCB including a bending portion, wherein the FPCB includes:

a first conductive layer in which a first conductive line forming a ground is disposed, a second conductive layer including a second conductive line disposed between the flexible display and the first conductive line, and a third conductive layer including a third conductive line disposed on a side opposite a side on which the second conductive line is disposed with reference to the first conductive line, wherein the first conductive line is electrically connected to a ground plane formed in the first housing or the second housing, and the second conductive line includes an antenna signal line.

17. The electronic device of claim 16, further comprising:

a first bracket disposed in the first housing and a second bracket disposed in the second housing, wherein the FPCB includes:

a first fixing area configured to fix an area of the FPCB to the first bracket, a second fixing area configured to fix another area of the FPCB to the second bracket, and a deformable area disposed between the first fixing area and the second fixing area.

18. The electronic device of claim 17, wherein at least one of the first fixing area and the second fixing area includes:

a fourth conductive layer stacked on a face of the second conductive layer to face the flexible display, the fourth conductive layer including a first ground wiring line, and a fifth conductive layer stacked on a face of the third conductive layer to face the hinge cover, the fifth conductive layer including a second ground wiring line.

19. The electronic device of claim 18, wherein the first conductive line, the second conductive line, the third conductive line, and the first ground wiring line are disposed to face the flexible display, and wherein the second ground wiring line is disposed to face opposite the flexible display.

20. A foldable electronic device comprising: a display; a hinge cover configured to cover a hinge structure; and a flexible printed circuit board disposed between the flexible display and the hinge cover, wherein the flexible printed circuit board includes: a hinge cover section accommodated in the hinge cover, a first connection section extending to a first side of the hinge cover section, and a second connection section extending to a second side of the hinge cover section, wherein the hinge cover section includes: a first fixing area extending from the first connection section and configured to fix an area of the flexible printed circuit board to the electronic device, a second fixing area extending from the second connection section and configured to fix another area of the flexible printed circuit board to the electronic device, and a deformable area disposed between the first fixing area and the second fixing area, and wherein a number of multiple conductive layers forming the first fixing area and a number of conductive layers forming the second fixing area are equal to each other, and a number of multiple conductive layers forming the deformable area and the number of multiple conductive layers forming the first fixing area are different from each other.

* * * * *